US008780618B2

(12) United States Patent
Lua et al.

(10) Patent No.: US 8,780,618 B2
(45) Date of Patent: Jul. 15, 2014

(54) WRITING CIRCUIT FOR A MAGNETORESISTIVE MEMORY CELL

(71) Applicants: Yan Hwee Sunny Lua, Singapore (SG); Aarthy Mani, Singapore (SG)

(72) Inventors: Yan Hwee Sunny Lua, Singapore (SG); Aarthy Mani, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 25 days.

(21) Appl. No.: 13/708,872

(22) Filed: Dec. 7, 2012

(65) Prior Publication Data
US 2013/0343117 A1 Dec. 26, 2013

Related U.S. Application Data

(60) Provisional application No. 61/568,683, filed on Dec. 9, 2011.

(51) Int. Cl.
*G11C 11/00* (2006.01)
(52) U.S. Cl.
USPC .......................................................... 365/158
(58) Field of Classification Search
CPC ............................ G11C 11/1675; G11C 11/16
USPC .......................................................... 365/158
See application file for complete search history.

(56) References Cited

U.S. PATENT DOCUMENTS

| | | | |
|---|---|---|---|
| 2009/0091969 A1* | 4/2009 | Ueda | 365/148 |
| 2011/0026317 A1* | 2/2011 | Zhu et al. | 365/158 |
| 2011/0249491 A1* | 10/2011 | Abedifard et al. | 365/171 |

OTHER PUBLICATIONS

Wei-Gang Wang, et al., "Electric-field-assisted switching in magnetic tunnel junctions," Nature Materials, vol. 11, pp. 64-68 (Jan. 2012).

* cited by examiner

*Primary Examiner* — Anthan Tran
(74) *Attorney, Agent, or Firm* — Blakely, Sokoloff, Taylor & Zafman LLP

(57) ABSTRACT

According to embodiments of the present invention, a writing circuit for a magnetoresistive memory cell is provided. The writing circuit includes a first connecting terminal configured to provide a first electrical signal to switch a variable magnetization orientation of the free magnetic layer from a first magnetization orientation to a second magnetization orientation; a second connecting terminal configured to provide a second electrical signal to switch the magnetization orientation from the second magnetization orientation to the first magnetization orientation; and a sourcing switch configured to provide for a write operation a connection of the first or second connecting terminal to a node coupleable to the magnetoresistive memory cell. The first and second electrical signals have different amplitudes, and the first and second electrical signals are of the same polarity. Further embodiments relate to a memory cell arrangement and a method of writing into a target magnetoresistive memory cell.

20 Claims, 21 Drawing Sheets

WRITING CIRCUIT FOR A MAGNETORESISTIVE MEMORY CELL

CROSS-REFERENCE TO REARED APPLICATION

This application claims the benefit of priority of U.S. provisional patent application No. 61/568,683, filed 9 Dec. 2011, the content of it being hereby incorporated by reference in its entirety for all purposes.

TECHNICAL FIELD

Various embodiments relate to a writing circuit for a magnetoresistive memory cell, a memory cell arrangement, and a method of writing into a target magnetoresistive memory cell of a memory cell arrangement.

BACKGROUND

Non-volatile memories usage is widely spreading as they allow reduction of the power consumption of the memory chips, due to the fact that they retain data without any external source. Flash memory is currently being used in a wide variety of devices but suffers from a limited endurance and lowers writing speed.

New types of memories are being developed to overcome these limitations. For example, Phase Change Random Access Memories (PCRAM) and Magnetic Random Access Memories (MRAM) have been identified by the International Technology Roadmap for Semiconductors (ITRS) as most adequate for flash memory replacement.

Typical MRAM structure is based on magnetic tunnel junctions using ferromagnetic materials separated by a thin insulator barrier through which electrons flow by tunnel effect. One of the ferromagnetic materials has its magnetization pinned (or also may be referred to as a pinned layer or a fixed magnetic layer) while the second ferromagnetic layer is set so that its magnetization can be switched from a direction parallel to the direction of the magnetization of the pinned layer (labeled as the P state) to a direction anti-parallel to the direction of the magnetization (i.e., magnetization orientation) of the pinned layer (labeled as the AP state). The second ferromagnetic layer may be referred to as the free layer or the free magnetic layer. The resistance of the AP state is higher than the resistance of the P state, allowing the system to store data as "1" for the high resistance state and "0" for the low resistance state.

Conventional MRAM require a magnetic field to be generated in order to write data (i.e., to switch the magnetization of the free layer) and suffer from a lack of scalability due to the current required to generate a high enough magnetic field at small dimensions. Passing polarized currents through a magnetic layer can reverse its magnetization, a phenomenon known as spin transfer torque. The effect of spin transfer torque forms the basis of spin torque transfer MRAM (STT-MRAM) and allows high scalability of the storage devices as the current required to write data decreases with the size of the MRAM cell. Typical STT-MRAM requires a current density of about $10^6$ A/cm$^4$ to write data and further reduction of this current density allows the development of low-power consumption devices, integrating with current CMOS technology node. However, writing current densities for pure spin-torque effect is approaching a limit.

Electric field assisted modification of the anisotropy of magnetic layers may help reach lower writing current densities. Hence, it is a need to have write and sense circuits configured for MRAM that utilizes a combination of spin torque transfer and electric field assisted anisotropy tuning.

SUMMARY

According to an embodiment, a writing circuit for a magnetoresistive memory cell is provided. The magnetoresistive memory cell may have a fixed magnetic layer and a free magnetic layer. The writing circuit may include a first connecting terminal configured to provide a first electrical signal to switch a variable magnetization orientation of the free magnetic layer from a first magnetization orientation to a second magnetization orientation; a second connecting terminal configured to provide a second electrical signal to switch the magnetization orientation of the free magnetic layer from the second magnetization orientation to the first magnetization orientation; and a sourcing switch configured to provide for a write operation a connection of one of the first connecting terminal or the second connecting terminal to a node coupleable to the magnetoresistive memory cell, wherein the first electrical signal and the second electrical signal have different amplitudes; and wherein the first electrical signal and the second electrical signal are of the same polarity.

According to an embodiment, a memory cell arrangement is provided. The memory cell arrangement may include a plurality of magnetoresistive memory cells, each magnetoresistive memory cell having a fixed magnetic layer and a free magnetic layer; and a writing circuit for the magnetoresistive memory cell, the writing circuit including: a first connecting terminal configured to provide a first electrical signal to switch a variable magnetization orientation of the free magnetic layer from a first magnetization orientation to a second magnetization orientation; a second connecting terminal configured to provide a second electrical signal to switch the magnetization orientation of the free magnetic layer from the second magnetization orientation to the first magnetization orientation; and a sourcing switch configured to provide for a write operation a connection of one of the first connecting terminal or the second connecting terminal to a node coupleable to the magnetoresistive memory cell, wherein the first electrical signal and the second electrical signal have different amplitudes; and wherein the first electrical signal and the second electrical signal are of the same polarity.

According to an embodiment, a method of writing into a target magnetoresistive memory cell of a memory cell arrangement is provided. The method may include providing a first electrical signal to switch a variable magnetization orientation of a free magnetic layer of the target magnetoresistive memory cell from a first magnetization orientation to a second magnetization orientation; providing a second electrical signal to switch the magnetization orientation of the free magnetic layer from the second magnetization orientation to the first magnetization orientation; and providing for a write operation one of the first electrical signal or the second electrical signal to a node coupleable to the magnetoresistive memory cell, wherein the first electrical signal and the second electrical signal have different amplitudes; and wherein the first electrical signal and the second electrical signal are of the same polarity.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of a method are analogously valid for a device, and vice versa.

In the context of various embodiments, the articles "a", "an" and "the" as used with regard to a feature or element includes a reference to one or more of the features or elements.

In the context of various embodiments, the phrase "at least substantially" may include "exactly" and a reasonable variance.

As used herein, the term "and/or" includes any and all combinations of one or more of the associated listed items.

Various embodiments may provide non-volatile memory devices, more specifically, write and sense circuits for magnetoresistive random access memory (MRAM). The write and sense circuits may be write and sense CMOS circuits.

Various embodiments may relate to MRAM single-bit per cell and multi-bit per cell using electric field with spin transfer torque assistance.

Various embodiments may provide write and sense circuits for the magnetoresistive memory elements and magnetic memories with single-bit per cell (SBPC) and multi-bits per cell (MBPC) using electric field with spin torque transfer (STT) assistance.

In various embodiments, for SBPC, a unidirectional write circuitry may be used to generate the voltage pulse with controlled amplitudes to write the logic states in the magnetic tunnel junction (MTJ) cells by providing desired switching electric field. The information (or bit) stored in SBPC may be read by current sense circuitry.

In various embodiments, for MBPC, the write pulse with both controlled amplitude and direction may be used to set the logic states of the MTJ cells with multi-bits.

For the reading, the read pulse may be passed into the selected cell, the signal from the cell may be compared using simplified sense amplifiers with reference voltages and a multiplexer for decoding the different voltage levels into binary data bits in a sense/read circuitry. By having localized write and sense circuits in the modular memory blocks, the write and read speed of the memory may be improved with symmetric path and reduction on electrical potential drop along the routing.

In order that the invention may be readily understood and put into practical effect, particular embodiments will now be described by way of examples and not limitations, and with reference to the figures.

Figure 1:
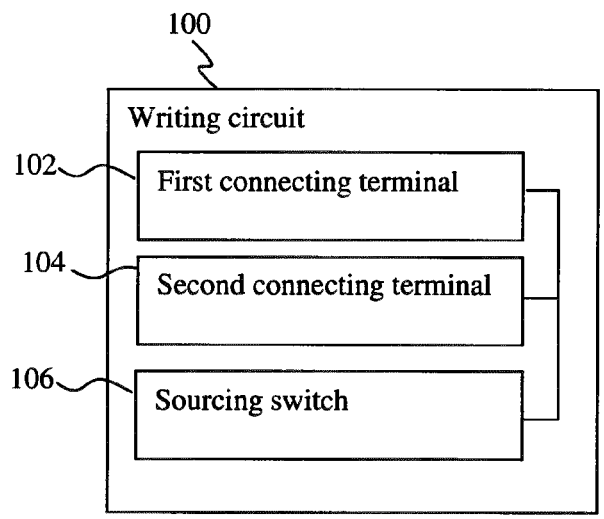
FIG. 1 shows a schematic block diagram of a writing circuit, according to various embodiments.

FIG. 1 shows a schematic block diagram of a writing circuit 100, according to various embodiments. The writing circuit 100 may include a writing circuit for a magnetoresistive memory cell having a fixed magnetic layer and a free magnetic layer. The writing circuit 100 includes a first connecting terminal 102 configured to provide a first electrical signal to switch a variable magnetization orientation of the free magnetic layer from a first magnetization orientation to a second magnetization orientation; a second connecting terminal 104 configured to provide a second electrical signal to switch the magnetization orientation of the free magnetic layer from the second magnetization orientation to the first magnetization orientation; and a sourcing switch 106 configured to provide for a write operation a connection of one of the first connecting terminal 102 or the second connecting terminal 104 to a node coupleable to the magnetoresistive memory cell, wherein the first electrical signal and the second electrical signal may have different amplitudes; and wherein the first electrical signal and the second electrical signal may be of the same polarity.

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hardwired logic circuit or a programmable logic circuit such as a programmable processor, e.g., a microprocessor (e.g., a Complex Instruction Set Computer (CISC) processor or a Reduced Instruction Set Computer (RISC) processor). A "circuit" may also be a processor executing software, e.g., any kind of computer program, e.g., a computer program using a virtual machine code such as e.g., Java. Any other kind of implementation of the respective functions which will be described in more detail below may also be understood as a "circuit" in accordance with an alternative embodiment.

In the context of various embodiments, the term "electrical signal" may refer to either a voltage or a current.

In various embodiments, the first electrical signal and the second electrical signal may be positive voltage signals. In other words, the first electrical signal may be a first voltage (or equivalently a first electric field) of a predefined polarity (e.g. a positive voltage) and the second electrical signal may be a second voltage (or equivalently a second electric field) having the same polarity (e.g., also a positive voltage).

For example, the electrical signal may be obtained from a voltage source or a current source. In other examples, the electrical signal may be obtained from a voltage divider circuit or a current divider circuit, or a current mirror, or a constant or variable current source, or a voltage bias. It should also be appreciated that the electrical signal may be stabilized and/or conditioned, for example, using a buffer and/or a voltage regulator.

In various embodiments, the first electrical signal may have a voltage amplitude larger than that of the second electrical signal.

For example, the voltage amplitude of the first electrical signal may be between about 0.8 V and about 3.3V, which the voltage amplitude of the second electrical signal (i.e., being relatively smaller than that of the first electrical signal) may be between about 0.3 V and about 1.8 V.

It should be appreciated that the electrical signal may have any voltage or current amplitude suitable to write to the magnetoresistive memory cell based on spin-torque effect and electric field assisted.

By using the first electrical signal or the second electrical signal, the writing of the magnetoresistive memory cell may be achieved with a current density of between about $10^2$ $A/cm^2$ and about $10^5$ $A/cm^2$.

The term "magnetization orientation" may be but is not limited to in either (i) perpendicular, or (ii) a composition of both perpendicular and in-plane configurations. The magnetization orientation of the free magnetic layer may affect the resistance of the magnetoresistive memory cell. The term "magnetization orientation" is further elaborated below.

In various embodiments, the first magnetization orientation and the second magnetization orientation of the free magnetic layer may respectively correspond to an anti-parallel state and a parallel state of the free magnetic layer with reference to the fixed magnetic layer. Generally, the anti-parallel state corresponds to a high resistance state of the magnetoresistive memory cell, while the parallel state corresponds to a low resistance state of the magnetoresistive memory cell.

In one example, the first and second electrical signals may be used for writing single-bit per cell (SBPC), or part of multi-bits per cell (MBPC).

The term "write operation" refers to an operation where a data bit (i.e., logic '1' or logic '0') is written or stored in the magnetoresistive memory cell.

As used herein, the term "polarity" with respect to the electrical signal may generally used in its conventional sense in the context of an electrical circuit, namely that, in a circuit, current flows from the positive node towards the negative node. For example, a direct current (DC) circuit has a positive node and a negative node, and current always flows in the same direction. The polarity of the electrical signal may be understood to mean the polarity of the electrical signal that is applied across at least two nodes (or terminals) of the magnetoresistive memory cell.

In various embodiments, the sourcing switch 106 may include a plurality of transistors respectively having a source terminal, a drain terminal and a gate terminal and a substrate or body terminal.

For the sourcing switch 106, the drain terminals of the transistors may be configured to couple to a bit line, the source terminal of a first transistor of the plurality of transistors may be coupled to the first connecting terminal 102, and the source terminal of a second transistor of the plurality of transistors may be coupled to the second connecting terminal 104.

In various embodiments, the writing circuit 100 may further include a control switch configured to control the write operation to the magnetoresistive memory cell. The control switch may be controllable by a word line (WL) of the magnetoresistive memory cell. The control switch may be a CMOS transistor. For example, the control switch may be a NMOS transistor.

In the context of various embodiments, the term "control" may refer to enabling or disabling.

The control switch may be configured to couple in series with the magnetoresistive memory cell between a bit line and a source line, and to switch between a low impedance to enable the write operation and a high impedance to disable the write operation.

In the context of various embodiments, the term "in series" may refer to being arranged one after another to form a line, consecutively or non-consecutively.

In one embodiment, the magnetoresistive memory cell may further include a second free magnetic layer. This magnetoresistive memory cell may be used for storing multi-bits per cell (MBPC).

In this embodiment, the writing circuit 100 may further include a third connecting terminal configured to provide a third electrical signal to switch a variable magnetization orientation of the second free magnetic layer from a first magnetization orientation to a second magnetization orientation; a fourth connecting terminal configured to provide a fourth electrical signal to switch the magnetization orientation of the second free magnetic layer from the second magnetization orientation to the first magnetization orientation; and a second sourcing switch configured to provide for the write operation a connection of one of the third connecting terminal or the fourth connecting terminal to a second node coupleable to the magnetoresistive memory cell, wherein the third electrical signal and the fourth electrical signal may have different amplitudes; and wherein the third electrical signal and the fourth electrical signal may be of the same polarity.

The terms "electrical signal", "magnetization orientation", and "polarity" may be defined as above.

In one embodiment, the third electrical signal and the fourth electrical signal may be positive voltage signals. In other words, the third electrical signal may be a third voltage (or equivalently a third electric field) of a predefined polarity (e.g. a positive voltage) and the fourth electrical signal may be a fourth voltage (or equivalently a fourth electric field) having the same polarity (e.g., also a positive voltage).

The first electrical signal may have a voltage amplitude larger than the respective voltage amplitudes of the third electrical signal and the fourth electrical signal.

For example, the voltage amplitude of the third electrical signal may be between about 0.8V and about 3.3V, which the voltage amplitude of the fourth electrical signal (i.e., being relatively smaller than that of the third electrical signal) may be between about 0.3V and about 1.8V.

Similar to the first and second signals, it should be appreciated that each of the third electrical signal and the fourth electrical signal may have any voltage or current amplitude suitable to write to the magnetoresistive memory cell based on spin-torque effect and electric field assisted.

By using the third electrical signal or the fourth electrical signal, the writing of the magnetoresistive memory cell may be achieved with a current density of between about $10^2$ A/cm$^2$ and about $10^5$ A/cm$^2$ In various embodiments, the writing circuit 100 may further include a first reference potential terminal; and a second reference potential terminal, wherein the sourcing switch 106 may be further configured to provide for the write operation a connection of the first reference potential terminal to the node when the second sourcing switch is providing the connection of one of the third connecting terminal or fourth connecting terminal to the second node; and wherein the second sourcing switch may be further configured to provide for the write operation a connection of the second reference potential terminal to the second node when the sourcing switch 106 is providing the connection of one of the first connecting terminal 102 or second connecting terminal 104 to the node.

As used herein, the term "node" refers to a connection point a common connection point for at least two electrical paths. The term "connection" may generally refer to a direct point-to-point link between two entities for an electrical signal to pass through to the node.

In the context of various embodiments, the first reference potential terminal and the second reference potential terminal, each may include a ground potential or about 0 V.

In various embodiments, the sourcing switch 106 may include a plurality of transistors respectively having a source terminal, a drain terminal and a gate terminal and substrate or body terminal.

For the sourcing switch 106, the drain terminals of the transistors may be configured to couple to a bit line (BL), the source terminal of a first transistor of the plurality of transistors may be coupled to the first connecting terminal 102, the source terminal of a second transistor of the plurality of transistors may be coupled to the second connecting terminal 104, and the source terminal of a third transistor of the plurality of transistors may be coupled to the first reference potential terminal.

In various embodiments, the second sourcing switch may include a plurality of transistors respectively having a source terminal, a drain terminal and a gate terminal.

For the second sourcing switch, the drain terminals of the transistors may be configured to couple to a source line (SL), the source terminal of a first transistor of the plurality of transistors may be coupled to the third connecting terminal, the source terminal of a second transistor of the plurality of transistors may be coupled to the fourth connecting terminal, and the source terminal of a third transistor of the plurality of transistors may be coupled to the second reference potential terminal.

Each of the transistors may be a metal oxide semiconductor transistor or a CMOS transistor. In some examples, each of the transistors may be a p-channel MOS (PMOS) transistor or an n-channel MOS (NMOS) transistor. For example, each of the first and second transistors may be a PMOS transistor and the third transistor may be an NMOS transistor.

In various embodiments, the writing circuit 100 may further include a first voltage source coupleable to the first connecting terminal 102, a second voltage source coupleable to the second connecting terminal 104, a third voltage source coupleable to the third connecting terminal, and a fourth voltage source coupleable to the fourth connecting terminal.

The term "voltage source" may refer to a voltage divider circuit or a current divider circuit, or a current mirror, or a constant or variable current source, or a voltage bias.

In various embodiments, the writing circuit 100 may further include a current overdriving protection circuit configured to limit the current level of one of the first electrical signal or the third electrical signal, wherein the first magnetization orientation and the second magnetization orientation of the free magnetic layer may respectively correspond to an anti-parallel state and a parallel state of the free magnetic layer with reference to the fixed magnetic layer; and wherein the first magnetization orientation and the second magnetization orientation of the second free magnetic layer may respectively correspond to an anti-parallel state and a parallel state of the second free magnetic layer with reference to the fixed magnetic layer.

In other words, excess or overdriving current may arise when the magnetoresistive memory cell changes from high resistance state to low resistance state. In one example, the current overdriving protection circuit may be realized using an invertor which may be activated to divert excess or overdriving current away from the magnetoresistive memory cell.

The term "correspond" refers to being related to.

In various embodiments, the writing circuit 100 may further include an address decoder and memory controller for controlling the write operation for the magnetoresistive memory cell.

In the context of various embodiments, the writing circuit 100 may include a plurality of sourcing switches (e.g., the sourcing switch 106) and second sourcing switches configured to respectively couple to a plurality of bit lines and source lines.

The plurality of bit lines and/or source lines may refer to data lines of the memory cell arrangement. For example, data may be sensed either at a bit line or at a source line.

Figure 2:
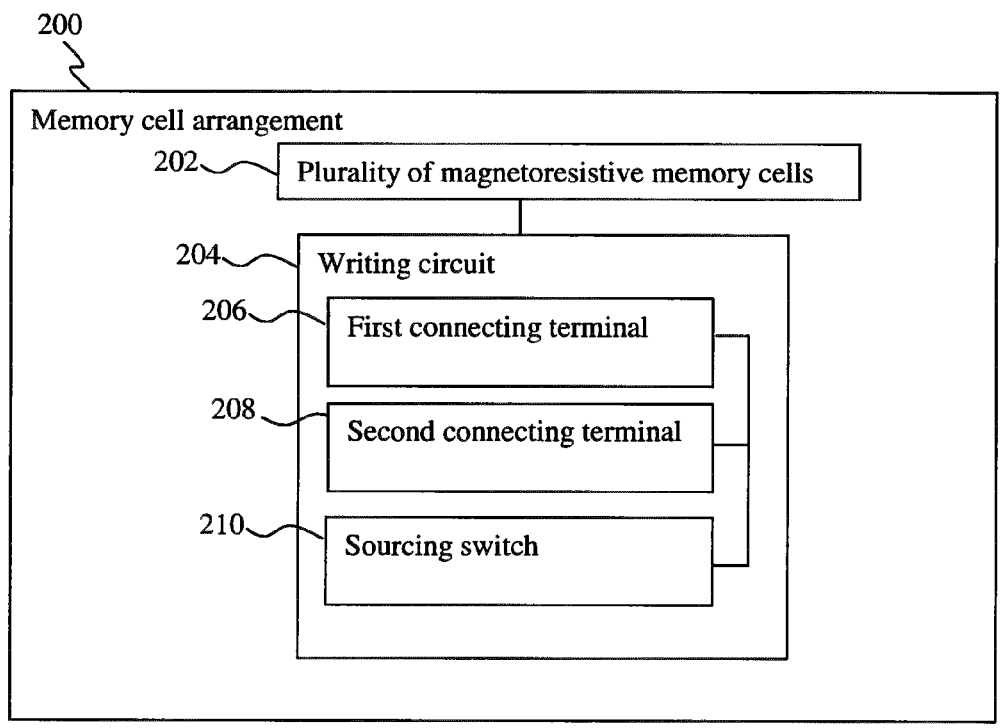
FIG. 2 shows a schematic block diagram of a memory cell arrangement, according to various embodiments.

FIG. 2 shows a schematic block diagram of a memory cell arrangement 200, according to various embodiments. The memory cell arrangement 200 may include a plurality of magnetoresistive memory cells 202; and a writing circuit 204 for the plurality of magnetoresistive memory cells 202. The writing circuit 204 may include a first connecting terminal 206 configured to provide a first electrical signal to switch a variable magnetization orientation of the free magnetic layer from a first magnetization orientation to a second magnetization orientation; a second connecting terminal 208 configured to provide a second electrical signal to switch the magnetization orientation of the free magnetic layer from the second magnetization orientation to the first magnetization orientation; and a sourcing switch 210 configured to provide for a write operation a connection of one of the first connecting terminal 206 or the second connecting terminal 208 to a node coupleable to the magnetoresistive memory cell, wherein the first electrical signal and the second electrical signal may have different amplitudes; and wherein the first electrical signal and the second electrical signal may be of the same polarity.

In the context of various embodiments, the term "memory cell arrangement" may be interchangably referred to as "memory" or "memory device".

in the context of various embodiments, the term "magnetoresistive memory cell" is used to describe a memory cell which can be switched between two or more states exhibiting different electrical resistance values in response to a magnetic field.

For example, the magnetoresistive memory cell may include a spin transfer torque magnetoresistive random access memory (STT-MRAM) with electric field assistance.

In various embodiments, the writing circuit 204 of FIG. 2 may be the writing circuit 100 of FIG. 1. The first connecting terminal 206, the second connecting terminal 208, and the sourcing switch 210 of FIG. 2 may be the first connecting terminal 102, the second connecting terminal 104, and the sourcing switch 106 of FIG. 1, respectively.

In various embodiments, the writing circuit 204 may further include a third connecting terminal configured to provide a third electrical signal to switch a variable magnetization orientation of the second free magnetic layer from a first magnetization orientation to a second magnetization orientation; a fourth connecting terminal configured to provide a fourth electrical signal to switch the magnetization orientation of the second free magnetic layer from the second magnetization orientation to the first magnetization orientation; and a second sourcing switch configured to provide for the write operation a connection of one of the third connecting terminal or the fourth connecting terminal to a second node coupleable to the magnetoresistive memory cell, wherein the third electrical signal and the fourth electrical signal may have different amplitudes; and wherein the third electrical signal and the fourth electrical signal may be of the same polarity.

The terms "polarity", "electrical signal", "node", "second node" and "write operation" may be as defined hereinabove.

It should be appreciated that the writing circuit 204 may be the writing circuit in accordance with various embodiments, as defined above.

In the memory cell arrangement 200, a logic control block may be used to control the set of select transistors/switches (e.g., the sourcing switch 210 and/or the second sourcing switch). The memory cell arrangement 200 may also include sub-blocks of memory arrays.

Figure 3A:
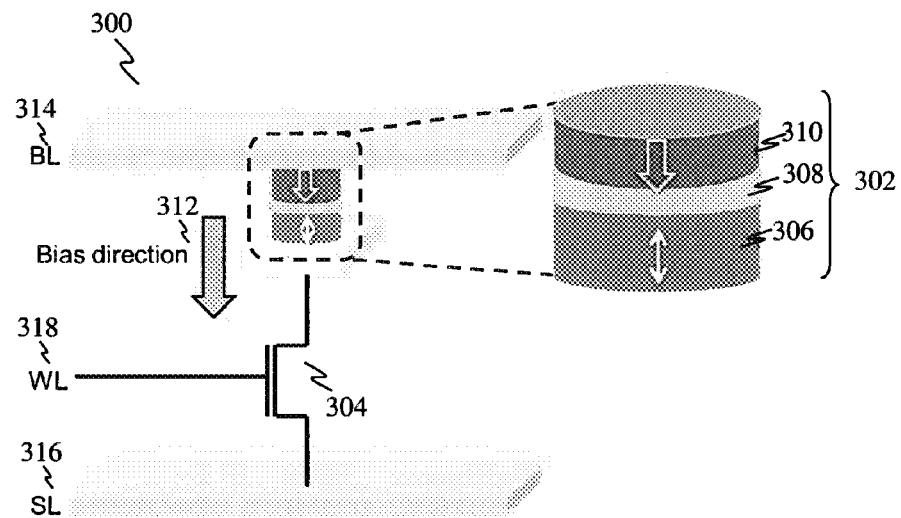
FIG. 3A shows a schematic diagram of a STT-MRAM with one MJT and one select transistor, according to various embodiments.

FIG. 3A shows a basic storage block of an electric field-assisted spin transfer torque magnetoresistive random access memory (EF-MRAM) 300 having one MTJ and one transistor, in accordance to various embodiments. In FIG. 3A, the EF-MRAM 300 includes or consists of the MTJ cell 302 connecting with a select transistor/device 304 (e.g., which may refer to the control switch as defined above). The MTJ stack 302 at least includes a ferromagnetic free layer (FL) 306, a tunneling layer (TL) 308 and a ferromagnetic reference layer (RL) 310. The TL 308 may be a insulator (spacer) arranged between the FL 306 and the RL 310.

The magnetization orientation of a MTJ stack (e.g., the MJT stack 302) may be in either (i) perpendicular, or (ii) a composition of both perpendicular and in-plane configurations. In FIG. 3A, the MJT stack 302 is in perdicular configuration as denoted by a directional arrow 312. The RL 310 may be coupled to a bit line (BL) 314 and the FL may be coupled to, for example, the drain terminal of the select transistor 304, which may be a n-channel MOS (NMOS) transistor. The source terminal of the select transistor 304 may be coupled to a source line (SL) 316 and the gate terminal of the select transistor 304 may be coupled to a word line (WL) 318. With CMOS process integration, the NMOS transistor may be used as the select transistor 304 as it occupies smaller silicon area as compared to a p-channel MOS transistor. The EF-MRAM 300 may be implemented using CMOS technology with the understanding of the differences in the driving window of the NMOS transistor under different bias polarities.

Both the FL 306 and RL 310 may be thin magnetic layers. The RL 310 may include, for example, (i) a magnetic hard ferromagnetic layer, (ii) a ferromagnetic layer exchanged coupled with an adjacent layer of anti-ferromagnetic material, or (iii) two or more ferromagnetic layers in antiferromagnetic coupling with an adjacent anti-ferromagnetic material. The tunnel barrier (or the TL 308) may be a magnesium oxide (MgO) layer with thickness range between 5 Å to 25 Å.

Figure 3B:
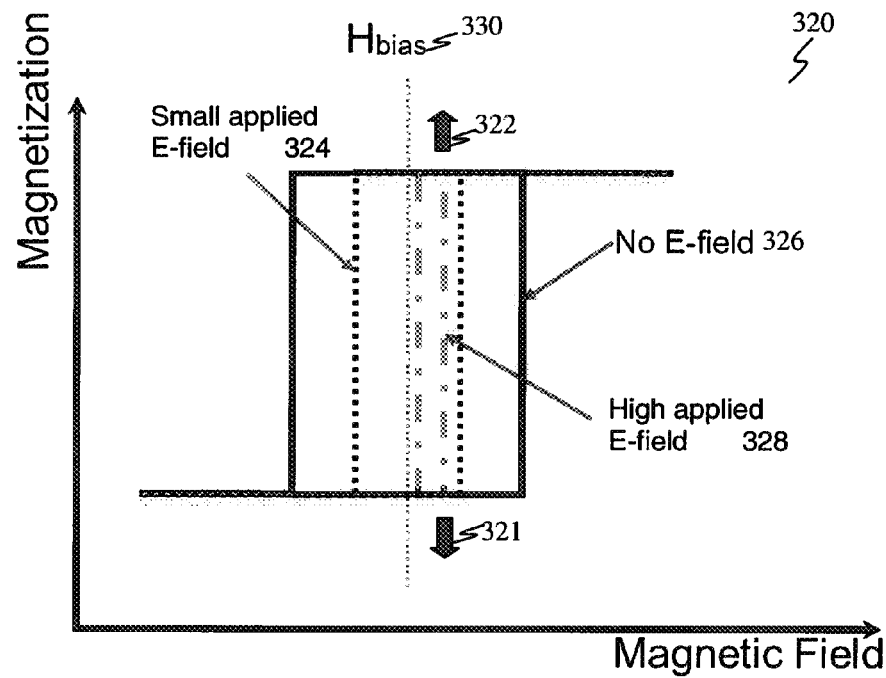
FIG. 3B shows the effect of applied electric field (EF) on the magnetic switching behaviour of the magnetic storage layer, according to various embodiments.

FIG. 3B shows a diagram 320 depicting the effect of applied electric field (EF) on the magnetic switching behavior of the magnetic storage layer, for example, the FL 306 of FIG. 3A. By applying electric field along a desired polarity, the coercivity of the storage layer may be reduced as shown in FIG. 3B. In FIG. 3B, the y-axis denotes magnetization (arbitary units) and the x-axis denotes magnetic field (A/m). The magnetic layer needs to be thin in order for the electric-field effect to dominate.

In more detail, the effect of applied EF as shown in FIG. 3B may be based on a reversible switching scheme called the unipolar switching scheme for device applications as described in W-G, Wang, et al. "Electric-field-assisted switching in magnetic tunnel junctions", Nature. Materials Vol 11, Pages 64-68 (2012). The following is described with reference to FIG. 3B and Wang et al, 2012 for illustration purposes. The scheme uses two voltage pulses of the same polarity but of different magnitudes to switch a MTJ (e.g. having a top cobalt-iron-boron (CoFeB) layer and a bottom CoFeB layer) between the parallel (P) and anti-parallel (AP) resistance states, which correspond to different magnetization orientations.

The voltage pulses are of desired polarity (for e.g., a negative polarity) and as a non-limiting example, the sign of the applied voltage may be defined so that a voltage pulse may stabilize the bottom CoFeB layer, and result in the top CoFeB layer being easier to switch. This corresponds to the electrons flowing from the top CoFeB layer to the bottom CoFeB layer.

Where the magnetization orientation of the bottom CoFeB layer is initially in the downward direction (as represented by the block arrow 321), for parallel to anti-parallel (P→AP) switching from a low resistance state to a high resistance state, switching of the top CoFeB layer may be achieved by lowering the coercivity of the top CoFeB layer, as well as assisted spin torque transfer (STT) switching from the scattered minority electrons from the bottom CoFeB layer, where such P→AP switching occurs at a pulse with a smaller magnitude. As a result, the magnetization orientation of the top CoFeB layer may be in an upward direction (as represented by the block arrow 322). As shown in FIG. 3B, when a voltage pulse with a small magnitude is applied, the coercivity of the top CoFeB layer is decreased, as represented by the M-H hysteresis loop 324, as compared to the M-H hysteresis loop 326 when no voltage pulse is applied.

For anti-parallel to parallel (AP→P) switching from a high resistance state to a low resistance state, of the top CoFeB layer, a voltage pulse of a larger magnitude may be used to decrease the coercivity of the top CoFeB layer even further, as represented by the M-H hysteresis loop 328, so that only the downward state 321 of the magnetization orientation of the top CoFeB layer is available at the applied magnetic bias field, $H_{bias}$, as represented by the dotted line 330. It should be appreciated that the bias field, $H_{bias}$, may be at least substantially constantly applied, as $H_{bias}$ may be self-generated by the system or the magnetoresistive device.

In a different example according to various embodiments, to write information to a single bit EF-MRAM cell (e.g. the EF-MRAM 300 of FIG. 3A), it may require two different amplitudes of voltage pulse for the write of binary "0" or "1".

Figure 3C:
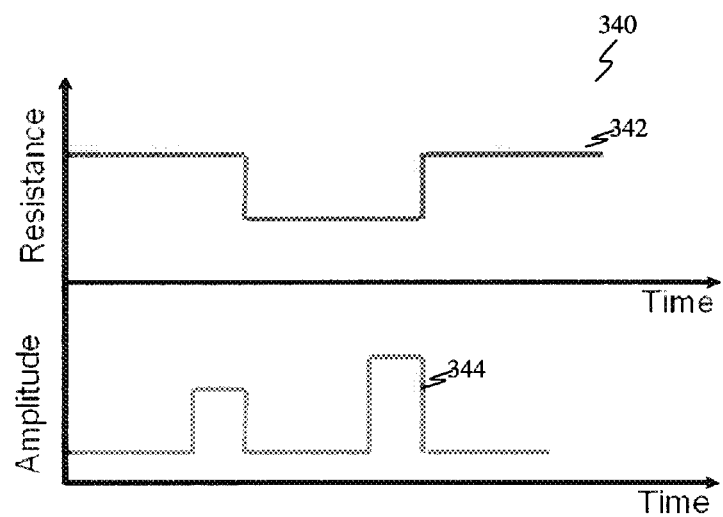
FIG. 3C shows resistance response of the EF-MRAM MTJ cell under the injection of different voltage amplitudes, according to various embodiments.

FIG. 3C shows the resistance response (typically in kohms or Mohms) of the EF-MRAM MTJ cell (e.g. the EF-MRAM 300 of FIG. 3A) under the injection of different voltage amplitudes (typically in voltage).

The resistance change 342 under different injected voltage pulse sequence 344 is shown in a diagram 340 of FIG. 3C, for the corresponding circuit arrangement in FIG. 3A. The low resistance level corresponds to a binary "0" and the high resistance level corresponds to a binary "1". The pulse 344 only applies in one direction, i.e., the same polarity. The applied pulses 344 and the corresponding electric field direction in the MTJ 302, needs to stabilize the reference layer 310, and at the same time makes the free layer 306 easier to switch. Although switching may occur by spin transfer torque, the current required for switching may be lowered when both combination of electric-field and spin-transfer torque occurred.

Based on the above requirements, the MTJ 302 may be placed above and routed to the NMOS transistor 304 with the RL 310 stacked above the FL 306 and having the FL 306 closer to the transistor 304, as shown in FIG. 3A. This is the unidirectional case where the voltage pulse 344 applied between the bit line (BL) 314, to the select line (SL) 316, with the MTJ 302 and the activated NMOS 304. This also allows for a wider operating window (or driving window) for the select transistor 304, which in turn, advantageously allows for a smaller transistor to be designed for smaller driving current requirement.

Figure 3D:
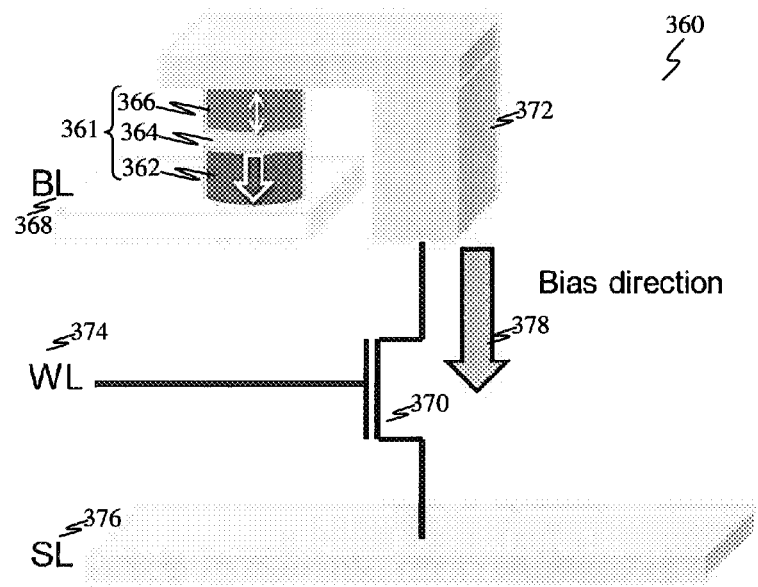
FIG. 3D shows a schematic diagram of another exemplary STT-MRAM with one MJT and one select transistor with re-routing, according to various embodiments.

FIG. 3D shows a schematic layout 360 of one MJT and one transistor design with re-routing. If the MTJ stack 361 needs to have the RL 362 grown before the FL 366 with the TL 364 arranged therebetween due to growth requirement, it is possible to have the same electrical connection by re-routing and placement in the layout design. In FIG. 3D, the RL 362 is coupled to a BL 368 and the FL 366 is coupled to a NMOS select transistor 370 at one terminal (e.g., the drain terminal) via a L-shaped connector 372. To complete the electrical path, the other terminal (e.g., source terminal of the select transistor 370) is coupled to a SL 376. A WL 374 is used to control the activation of the NMOS transistor 370. Electrical bias is shown by a block arrow 378.

One of the requirements for the above structure is that the device needs to operate at a suitable magnetic bias field. As the devices scale down to below 100 nm, the stray magnetic field from the RL may become so large such that no magnetic switching occurs in the FL. For efficient writing, a cancellation layer (CL) may be added adjacent to the FL separated by a conductive spacer or tunneling barrier layer as shown in a schematic diagram 400 of FIG. 4. The CL 401 is to provide magnetic field in opposite direction (as denoted by a directional arrow 402) with respect to the RL 404 (as denoted by a directional arrow 406) and is to reduce the stray field from the RL 404, acting on the FL 408. The CL 401 may be made from ferromagnetic magnetic and have a smaller coercivity as compared to the RL 404. The spacer layer 410 may be formed, for example, of metals, metallic alloys and/or lamination of the metallic materials. The materials, for example, may be Ta, Cu, Ru, Rh, Au, Ag, Pt, Pd, Ir, Mo, Nb, Cr, V, W, and Ti and their alloy, with a thickness range from 0.5 nm to 10 nm. The magnetic field strength of the CL 401 to counter that from the RL 404 may be adjusted by controlling the thickness of spacer layer 410. For tunneling barrier layer (or insulator spacer) 412, the materials may be the oxide, nitride or oxynitride of Al, Ti, Mg and their alloys. The CL 401 is coupled to a terminal (e.g., the drain terminal) of a select transistor 414 and the other terminal (e.g., the source terminal of the select transistot 414 is coupled to a SL 416. A WL 418 is used to control the activation of the select transistor 414. The select transistor 414 may be similar to the select transistor 304, 370 (FIGS. 3A and 3D, respectively). The RL 404 is coupled to a BL 420.

Figure 4:
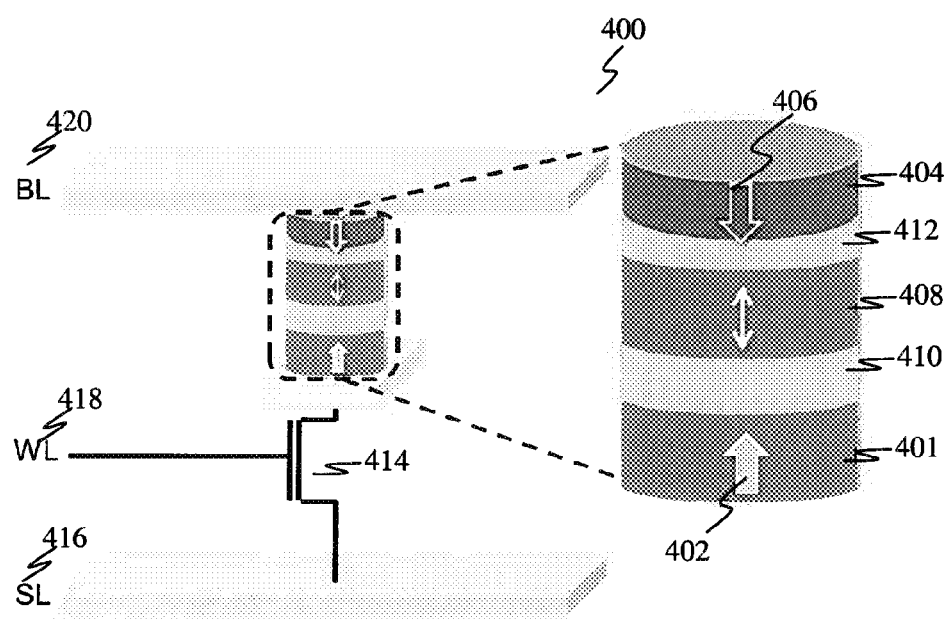
FIG. 4 shows a schematic diagram of a STT-MRAM with one MJT and a cancellation layer, according to various embodiments.
Figure 5:
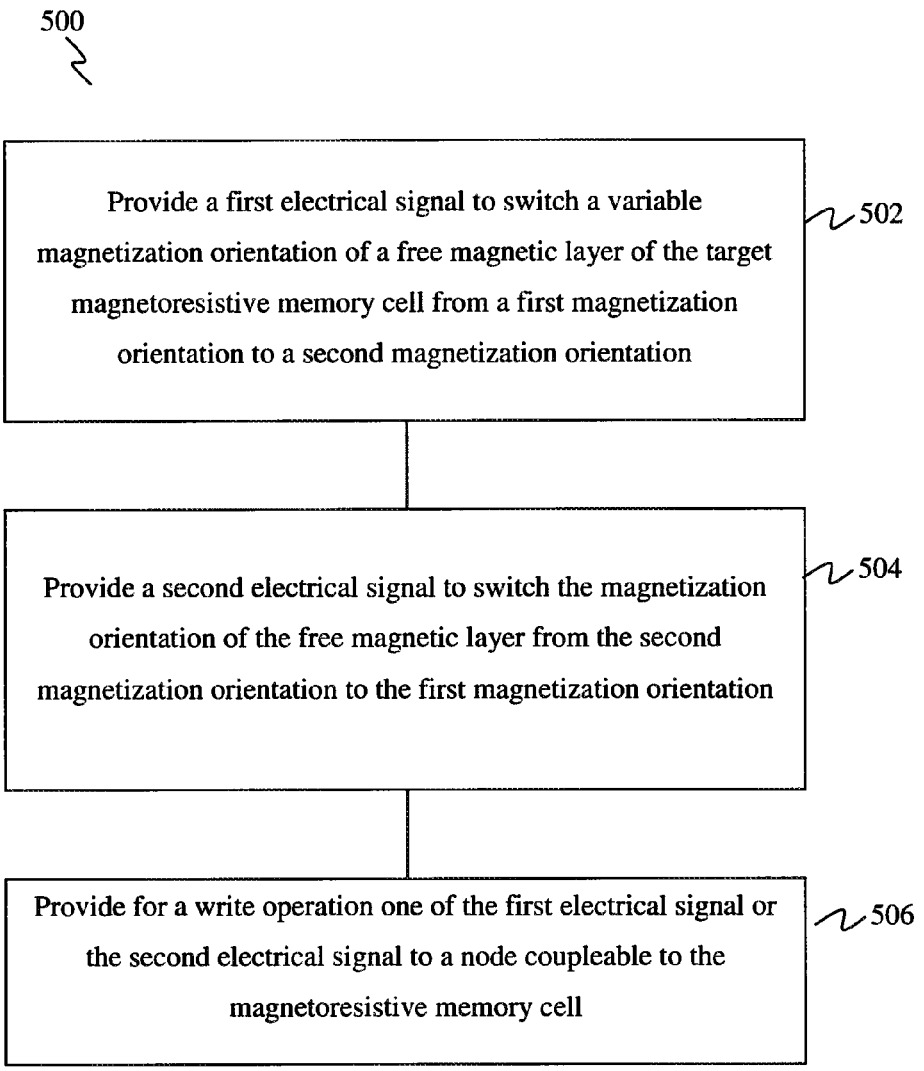
FIG. 5 shows a flow chart illustrating a method of writing into a target magnetoresistive memory cell, according to various embodiments.

FIG. 5 shows a flow chart 500 illustrating a method of writing into a target magnetoresistive memory cell (e.g. the magnetoresistive memory cell 300 of FIG. 3A or as shown in FIG. 3D or FIG. 4) of a memory cell arrangement (e.g. the memory cell arrangement 200 of FIG. 2), according to various embodiments.

At 502, a first electrical signal may be provided to switch a variable magnetization orientation of a free magnetic layer of the target magnetoresistive memory cell from a first magnetization orientation to a second magnetization orientation.

At 504, a second electrical signal may be provided to switch the magnetization orientation of the free magnetic layer from the second magnetization orientation to the first magnetization orientation.

At 506, for a write operation one of the first electrical signal or the second electrical signal may be provided to a node coupleable to the magnetoresistive memory cell.

At 502, 504, 506, the first electrical signal and the second electrical signal may have different amplitudes; and the first electrical signal and the second electrical signal may be of the same polarity.

In the context of various embodiments, the term "magnetoresistive memory cell", "memory cell arrangement", "electrical signal", "node", "magnetization orientation", "free magnetic layer", and "write operation" are as defined hereinabove.

In various embodiments, the method 500 may further include providing a third electrical signal to switch a variable magnetization orientation of a second free magnetic layer of the target magnetoresistive memory cell from a first magnetization orientation to a second magnetization orientation; providing a fourth electrical signal to switch the magnetization orientation of the second free magnetic layer from the second magnetization orientation to the first magnetization orientation; and providing for the write operation one of the third electrical signal or the fourth electrical signal to a second node coupleable to the magnetoresistive memory cell, wherein the third electrical signal and the fourth electrical signal may have different amplitudes; and wherein the third electrical signal and the fourth electrical signal may be of the same polarity.

In some examples, the method 500 may further include controlling the write operation to the magnetoresistive memory cell by a word line of the memory cell arrangement.

In other examples, the memory cell arrangement may include a plurality of magnetoresistive memory cells, and writing into each target resistive memory cell may be performed sequentially.

The method 500 may be performed using the writing circuit 100 of FIG. 1.

In this context of various embodiments, the first electrical signal, the second electrical signal, the third electrical signal, the fourth electrical signal may refer to the first electrical signal provided at the first connecting terminal 102, 206; the second electrical signal provided at the second connecting terminal 104, 208 of FIGS. 1 and 2, respectively.

Various embodiments provide a computer readable storage medium having a program with a program code for controlling the writing circuit by performing the steps of the method as described hereinabove. As used herein, the term "program" refers to the full breadth of its ordinary meaning. For example, the program may be a software program stored in a memory and executable by a processor (e.g., a computer's processor (CPU) or a controller's processor), or a hardware configuration program using programmable hardware elements.

Various embodiments may be provided as described in a set of exemplary write and sense CMOS circuits for single-bit-per cell (SBPC) and multi-bit-per-cell (MBPC) EF-MRAM.

As described above, an applied electric field across a magnetic tunnel junction (MTJ) may either decrease or increase the coercivity of thin cobalt-iron-boron (CoFeB) magnetic layers (Wang et al, 2012). The coercivity behavior of the CoFeB layer is determined by the accumulation/depletion of electrons at the MgO/CoFeB interface, depending on the sign of the applied electric field. If electrons accumulate at the interface, the perpendicular anisotropy of the CoFeB may decrease, and may even disappear at a high enough electric field. If electrons are depleted from the interface, the perpendicular anisotropy of the CoFeB layer strengthens, making it stable and harder to switch. In a basic MTJ structure (e.g., as in FIG. 3A) where a MgO tunnel barrier is sandwiched between two CoFeB magnetic layers, a constant applied electric field results in electron accumulation at one MgO/CoFeB interface, and electron depletion at the other. This implies that one of the CoFeB layers may be switched more easily than the other, and this allows reversible switching with layer selectivity. The writing scheme uses a combination of spin torque transfer and electric field assisted anisotropy tuning. Writing current densities 100 to 10,000 times lower than that for pure STT-MRAM may be achieved.

Various examples of write and sense circuits for the magnetoresistive memory elements and magnetic memories with single-bit per cell (SBPC) and multi-bits per cell (MBPC) using electric fields with spin torque transfer assistance are described as follow.

For SBPC, a unidirectional write pulse with controlled amplitudes is used to set the logic states of the magnetic tunnel junction (MTJ) cells by providing the desired electric field for switching. The information stored in SBPC may be read by current sensing.

For MBPC, the write pulse with both controlled amplitude and direction is used to set the logic states of the magnetic tunnel junction (MTJ) cells with multi-bits. For the sensing, the information read from the cell is then compared using simplified sense amplifiers with reference voltages/current and multiplexes for decoding the different voltage levels into binary data bits.

By having localized write and read circuits in the modular memory blocks, the write and read speed of the memory can be improved with symmetric path and reduction on electrical potential drop along the routing.

A single-bit with unipolar write configuration according to various embodiments will now be described below, by way of examples and not limitations.

Figure 6:
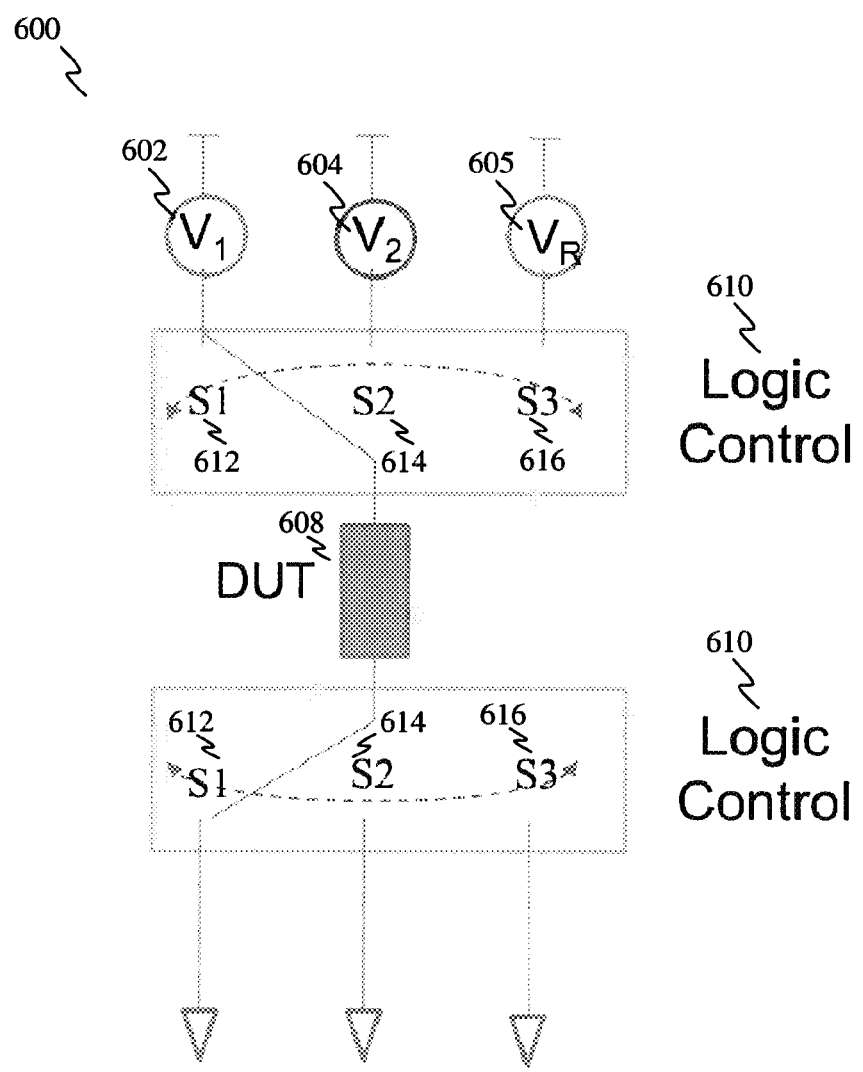
FIG. 6 shows a schematic drawing illustrating the selection of read and write voltage sources for a MJT cell, according to various embodiments.

The writing scheme of the EF-MRAM (e.g., the EF-MRAM 1300 of FIG. 3A) requires unidirectional write pulses with two different amplitudes ($V_1$ and $V_2$), to be delivered in same polarity. FIG. 6 shows the schematic layout 600 of the selection of two write 602, 604 and one read ($V_R$) 606 voltages to the MTJ cell (i.e., device under test DDT) 608. The voltage that has to be applied to the cell 608 is determined by the logic control block 610 which controls the set of select transistors/switches S1 to S3 612, 614, 616. This simplifies the design as well as making the sources 602, 604, 606 more compact and may be shared through the control of switches 612, 614, 616. Furthermore, the switches in the control logic at the bottom section may be further merged to be connected to ground directly.

Figure 7:
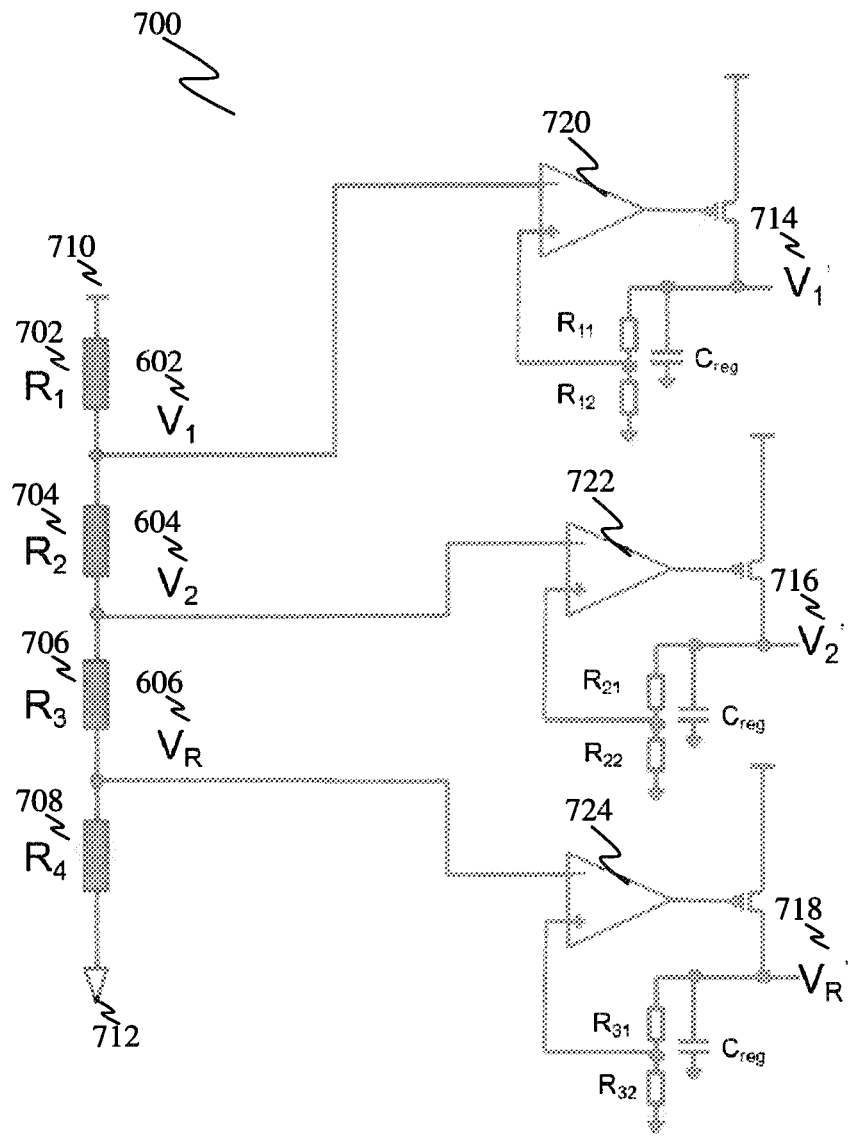
FIG. 7 shows a schematic drawing illustrating the use of a voltage (potential) divider for delivery of desired voltage amplitudes, according to various embodiments.

The different amplitudes of the voltage sources 602, 604, 606 may be derived from a potential divider circuit 700 as shown in FIG. 7 or by using voltage reference generators. Four resistors $R_1$ 702, $R_2$ 704, $R_3$ 706, and $R_4$ 708 are connected in series with the common voltage supply 710 and ground terminal 712. Dedicated voltage may be wired from the node between the resistors 702, 704, 706, 708. By selecting the value of the resistors 702, 704, 706, 708 used together with the voltage supply 710, the amplitudes of the write and read voltages 602, 604, 606 may be obtained.

In this arrangement, $V_1$ is larger than $V_2$, which is in turn larger than $V_R$ ($V_1 > V_2 > V_R$). The resistors 702, 704, 706, 708 may be fabricated from metal lines, polysilicon lines, and/or MOS transistors or using diffusion layers or using n/p well layers. To ensure that the voltage levels $V_1'$ 714, $V_2'$ 716, $V_R'$ 718 to be supplied for the memory sub-blocks are stable, dedicated voltage regulators 720, 722, 724 are added in series and next to each node of voltage level 602, 604, 606. The resistor dividers ($R_{11}$, $R_{12}$, $R_{21}$, $R_{22}$, $R_{31}$, $R_{32}$) of the voltage regulators 720, 722, 724 are used to provide feedbacks for correcting errors in voltage levels $V_1'$ 714, $V_2'$ 716, $V_R'$ 718.

Figure 8:
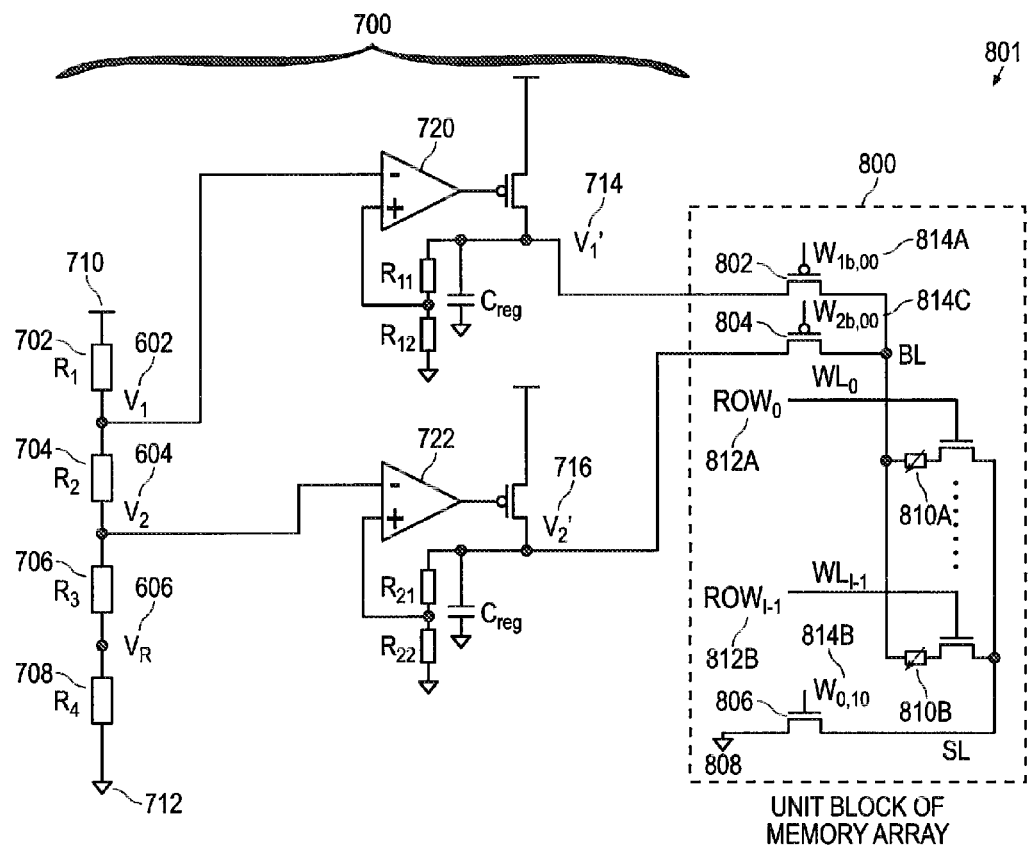
FIG. 8 shows a schematic drawing of the unidirectional writing circuit for a unit block of EF-MRAM memory array, according to various embodiments.

FIG. 8 shows a schematic diagram 801 illustrating the unidirectional writing circuit 700 for a unit block of EF-MRAM memory array 800. The basic unit block of the memory array 800 is connected to the write voltage nodes 714, 716 via PMOS transistors 802, 804. For the returned path, the NMOS transistor 806 is used to connect to the ground terminal 808. The routing to each cell 810A, 810B in the memory array 800 is designed in a symmetric fashion to allow for similar potential drop during the write process. This helps to maintain the writing speed of each cell 810A, 810B. To perform write on the cell 810A at row$_0$ 812A, write enable (WE) and word line WL$_0$ is activated to select the cell 810A. To send in $V_1$ pulse 602, $W_{1b,00}$ 814A and $W_{0,10}$ 814B is activated while the other transistors are switched off. The voltage pulse of amplitude $V_1$ 602 is delivered from top to bottom and to the cell 810A, following the path which is activated. Sequentially, it terminates at the ground terminal and all the switches is then all turned off. The pulse width may be controlled by the duration of WE signal. In a similar way, writing on the cell 810B at row$_{i-1}$ 812B may be performed by using write enable (WE) and word line WL$_{i-1}$ to be activated to select the cell 810B, A V$_2$ pulse 604 may be sent to the cells 810A, 810B in a similar manner.

To write a "1" EF-MRAM MTJ cell (low resistance, R$_L$, to high resistance, R$_H$), V$_2$ 604 is pulsed with the activation of W$_{2b,00}$ 814C and W$_{0,10}$ 814B. During the pulse injection, the electric field by V$_2$ 604 lowers the coercivity of the FL and the assisted by spin torque transfer (STT) switching from the scattered minority electrons from the FL, the FL may be easily switched from parallel (P) to anti-parallel (AP) state.

To write a "0" (high resistance, R$_H$, to low resistance, R$_L$), V$_1$ 602 (V$_1$>V$_2$) is pulsed to the EF-MRAM MTJ cell 810A, 810B. The presence of this larger electric field lowers the coercivity of FL further till it crossed the applied magnetic field acting on the FL applied, and the FL switches from the AP to P state by electric field effect.

Figure 9:
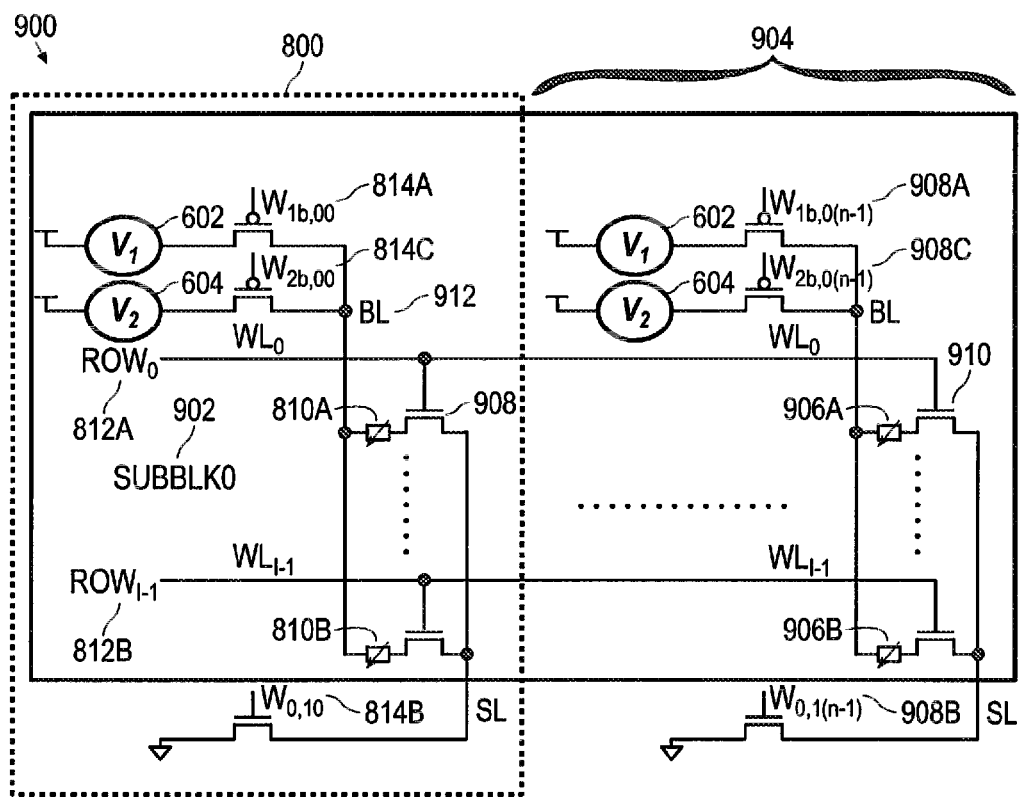
FIG. 9 shows a block diagram of the unidirectional writing circuit for the unit block of EF-MRAM memory array of FIG. 8, according to various embodiments.

A circuit 900 including the writing circuit may be broken to driving a smaller sub-block of memory array 902 as shown in FIG. 9. The size of the sub-block (e.g. SUBBLK0 902) depend on the loading of the memory cells. In FIG. 9, SUB-BLK0 902 is made up of the unit block 800 of FIG. 8 and similar unit block(s) 904 connected in a manner such that write enable (WE) 812A, 812B and electrical signal 602, 604 are applied to the cells in the SUBBLK0 902 in parallel. In unit block(s) 904, the activation of V$_1$ 602 and V$_2$ 604 to be applied to cells 906A, 906B may be controlled by W$_{1b,0(n-1)}$ 908A and W$_{2b,0(n-1)}$ 908C, respectively with W$_{0,1(n-1)}$ 908B.

For example in FIG. 9, to write a logic '0' to the MTJ in the top left-hand column, the row$_0$ word line (WL$_0$) for the MTJ is set high and the select transistor 908 is switched on. With other transistors switched off and only transistors W$_{1b,00}$ 814A and W$_{0,10}$ 814B of the writing circuit are switched on, the voltage pulse V$_1$ 602 is then injected and flow from the top into the bit line 912, through the MTJ 810A and the select transistor 908 and closes the loop at the ground terminal next to the transistor W$_{0,10}$ 814B. In other words, W$_0$=1; W$_{1b,00}$ 814A=0; W$_{0,10}$ 814B=1; and W$_{2b,00}$ 814C=1, a logic '0' is written into the MRAM cell 810A.

Figure 10:
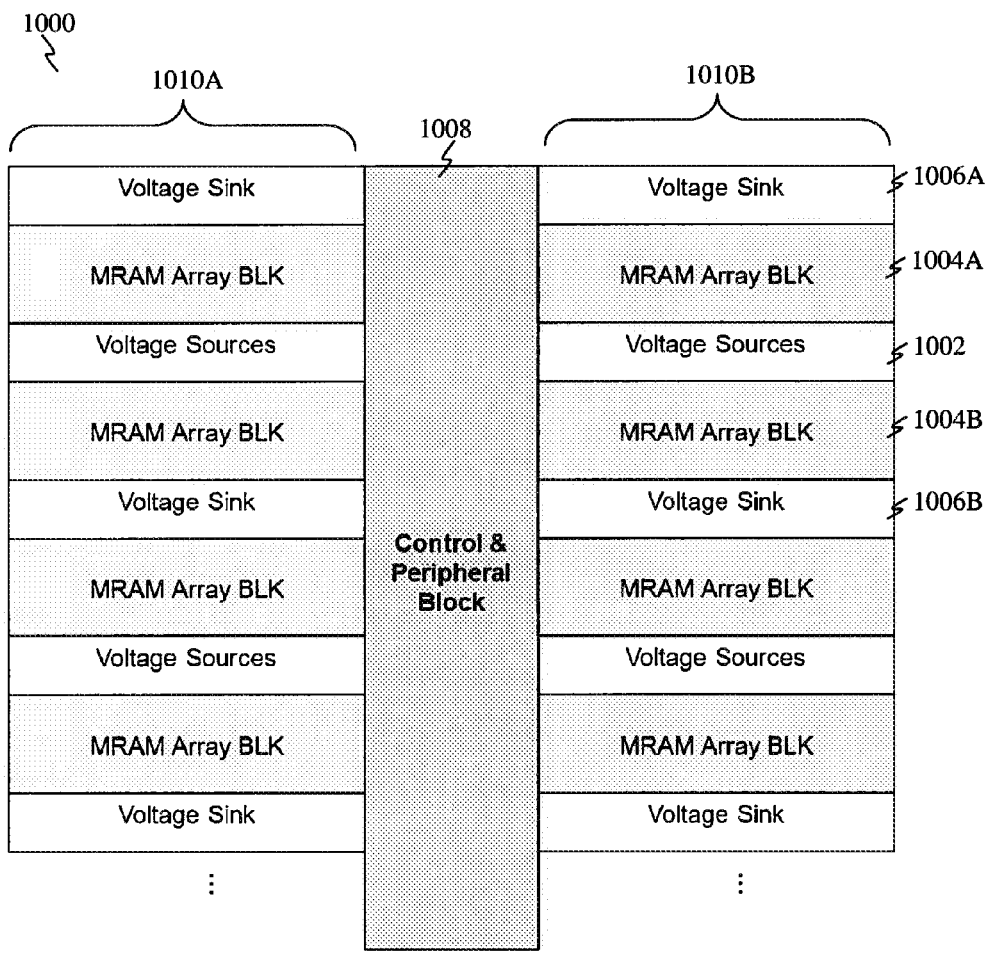
FIG. 10 shows a block diagram of the unidirectional writing circuit with voltage sources at the sides of memory sub-blocks, according to various embodiments.

For high writing speed, the using of smaller sub-blocks (e.g. SUBBLK0 900) of memory array may help to boost up the speed. Furthermore, the writing circuit may be shared between adjacent two sub-blocks of memory array as shown in an example of FIG. 10. In FIG. 10, a circuit 1000 includes the unidirectional writing circuit with voltage sources at two sides with the memory sub-blocks. This is to assist in the reduction of silicon area used. In addition, the electrical bias and addresses are reused in the design which results in further reduction of the area used. In this example, the voltage sources 1002 are sandwiched between two similar memory sub-blocks 1004A, 1004B. In addition, at the outer blocks next to the memory sub-blocks 1004A, 1004B, there are voltage sinks 1006A, 1006B to close the voltage path. The logic control and peripheral blocks 1008 lies at the center of two sides of larger memory array groups 1010A, 1010B. For example, the writing circuit may be the writing circuit 100 of FIG. 1.

Figure 11:
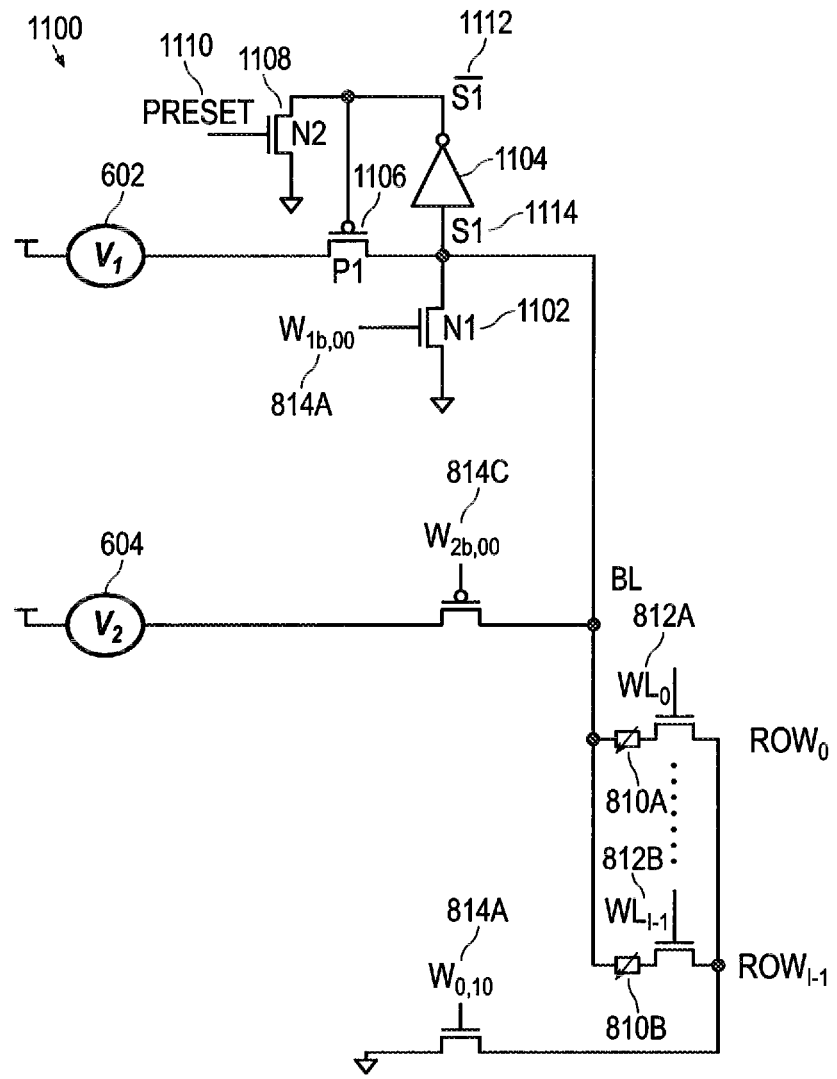
FIG. 11 shows a schematic drawing of the unidirectional writing circuit for a unit block of EF-MRAM memory array with a current overdriving protection circuit, according to various embodiments.

In addition to the writing circuit, a current overdriving protection circuit may be included to enhance the writing circuit, as shown by a circuit 1100 in FIG. 11. As shown in FIG. 11, the current overdriving protection circuit includes an inverter 1104 in an arrangement with a few switching transistors 1106, 1108 to divert overdriving current.

During the voltage pulse writing mode, the transition of high resistance state to low resistance state may result in the overdriving of current. If the resistance difference is large, the amount of current being overdrive is also proportional, based on V=IR characteristics. Without limiting the current supplied during the transition, there would be energy wastage, reduction in the lifetime of the MTJ, and the MTJ material properties may be degraded, or even be damaged.

To activate the V$_1$ voltage pulse 602, W$_{1b,00}$ 814A is set low to turn off NMOS N1 1102. The PRESET signal 1110 has a small pulse to activate the NMOS N2 1108, to pull down S1-bar signal 1112. Sequentially, this turns on the PMOS P1 1106. Voltage V$_1$ 602 then passes through node S1 1114 and the selected MTJ cell 810A, 810B is written. As the voltage on the S1 1114 is equal to V$_1$ 602, the output of the inverter 1112 is maintained at low value. The PMOS P1 1106 is then turned on during activation of V$_1$ pulse 602 and before the resistance state of the MTJ cell 810A, 810B changes.

With the MTJ cell 810A, 810B changes its state and having its resistance becoming much smaller, the potential at node S1 1114 is reduced. Once the potential at S1 1114 become much smaller than the threshold of the inverter 1104, the output of the inverter 1104 is pulled to VDD, sequentially. This consequently turns off PMOS P1 1106. This way, current overdriving protection is achieved.

A sense circuit for single-bit EF-MRAM according to various embodiments will now be described below, by way of examples and not limitations.

Figure 12:
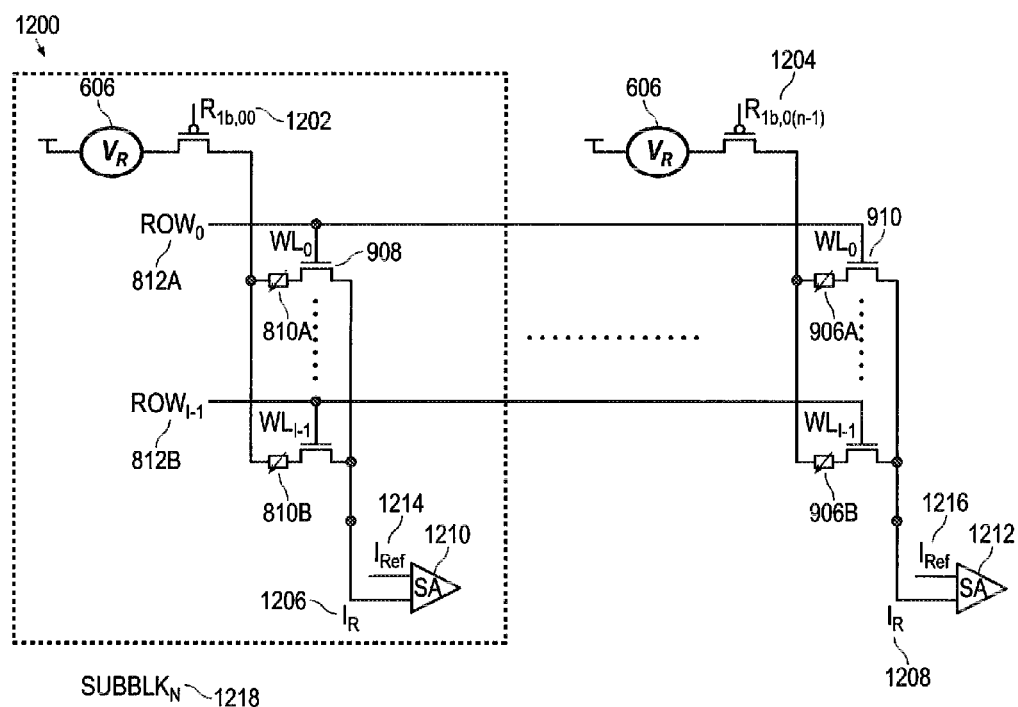
FIG. 12 shows a schematic drawing of a sense circuit for the EF-MRAM array sub-block, according to various embodiments.

To read-out the information stored in the EF-MRAM MTJ cell 810A, 810B, a read voltage 606 is used to source the cell 810A, 810B, 906A, 906B as shown in a sense circuit 1200 of FIG. 12. Based on a fixed V$_R$ 606, the selected MTJ cell 810A, 810B, 906A, 906B may determine the read current (I$_R$) 1206, 1208 which is sensed by the current sense amplifier 1210, 1212. A high (low) resistance corresponds to low (high) amount of I$_R$ 1206, 1208. At the sense amplifier 1210, 1212, I$_R$ 1206, 1208 is compared with a reference current (I$_{ref}$) 1214, 1216. If I$_R$>I$_{ref}$, a binary "0" is provided as the output, and if I$_R$<I$_{ref}$, a binary "1" is provided as the output The information is discretized in a binary fashion by the sense amplifier 1210, 1212. Depending on the loading of the V$_R$ source 606, the memory block 1218 can be broken-down into smaller sub-blocks, to ensure high reading speed. The symmetric routing among the memory also allows similar reading environment in the memory sub-blocks 1218.

As shown in FIG. 12, a read voltage (V$_R$) source 606 and current sense amplifier (SA) 1210, 1212 are used for the read operation in a memory sub-block 1218. In the following, the SBPC MTJ cell at column 0 and row 0 is used as an example for read operation. WL$_0$ is activated to select the cells at row$_0$ 812A. When read enable (RE) is activated, R$_{1b,00}$ 1202 is active while the other switched are in the off-state. This sequence activates only the cell at row 0 column 0. The read voltage 606 is sent through the path addressing the selected cell 810A, 810B. While the cell 810A, 810B is being read, the read current 1206 from the cell 8101, 810B is compared by the SA 1210. If the routing of the lines to the SA 1210 is long, the sense circuit 1200 may be broken down addressed to smaller memory sub-blocks (e.g. SUBBLK$_N$ 1218). This also reduces the potential drop along the routing line and improve on the reading speed.

Figure 13:
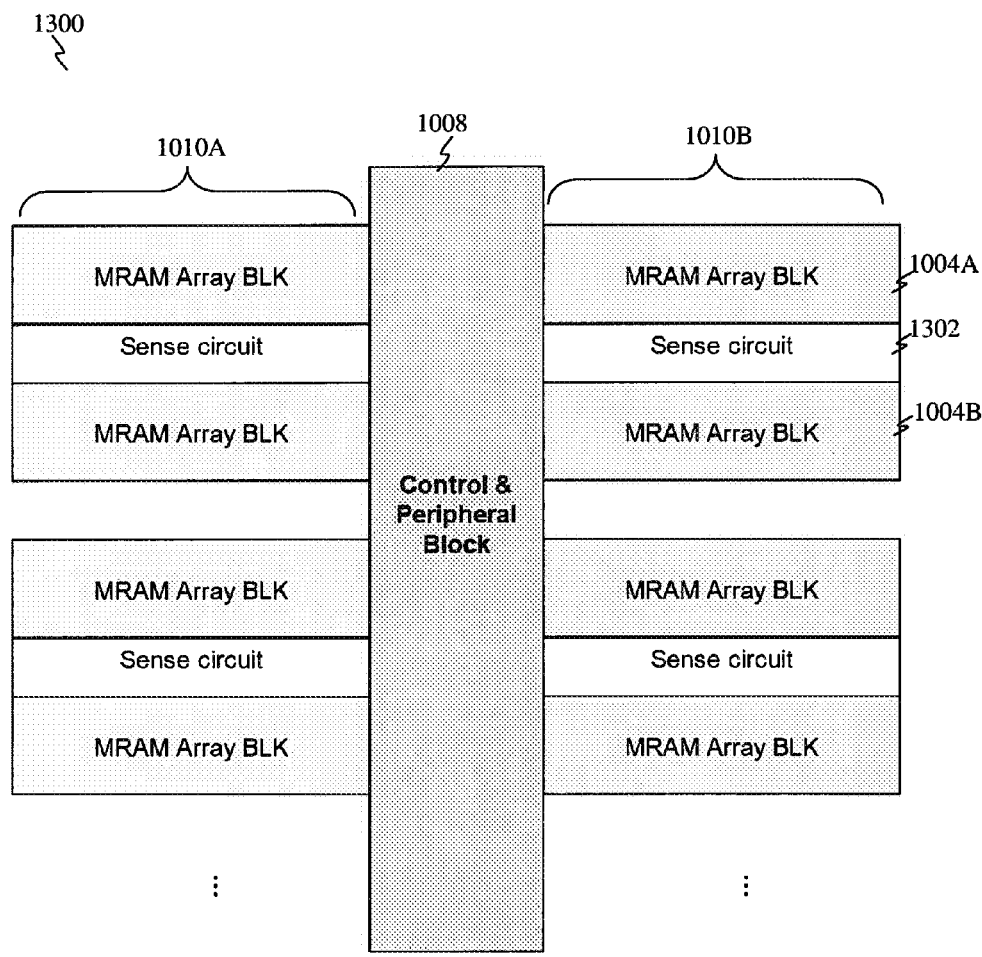
FIG. 13 shows a block diagram of the sense circuit for the EF-MRAM array sub-block of FIG. 12, according to various embodiments.

FIG. 13 shows a block diagram of the sense circuit in the EF-MRAM in memory sub-blocks. In FIG. 13, a circuit 1300 is based on the circuit 1000 of FIG. 10 illustrating the arrangement of the sense circuit 1302. This is to assist in the reduction of silicon area used. In addition, the electrical bias and addresses are reused in the design which results in further reduction of the area used. In this example, the sense circuit 1302 is sandwiched between two similar memory sub-blocks 1004A, 1004B. The logic control and peripheral blocks 1008 lies at the center of two sides of larger memory array groups 1010A, 1010B. For example, the sense circuit 1302 may be the sense circuit 1200 of FIG. 12.

A multi-bit-per-cell MRAM with electric-field assistance using spin transfer torque according to various embodiments will now be described below, by way of examples and not limitations.

As described above, the write and sense schemes of the single-bit-per-cell (SBPC) EF-MRAM memory array are addressed using unidirectional voltage sourcing (as seen in FIGS. 6-13). The write and sense schemes for multi-bit-per-cell EF-MRAM array is described as follow. In particular, the case for two-bits-per-cell (2BPC) is illustrated as an example. Unlike the SBPC EF-MRAM which uses unidirectional writing scheme, the 2BPC EF-MRAM requires a bi-directional writing scheme to write and store information in the cell. The structural design of the 2BPC EF-MRAM cell has at least two storage layers. The write mechanism requires either electric field or electric field assistance in combination with spin transfer torque effect, to switch the magnetic configuration of the cell.

Figure 14:
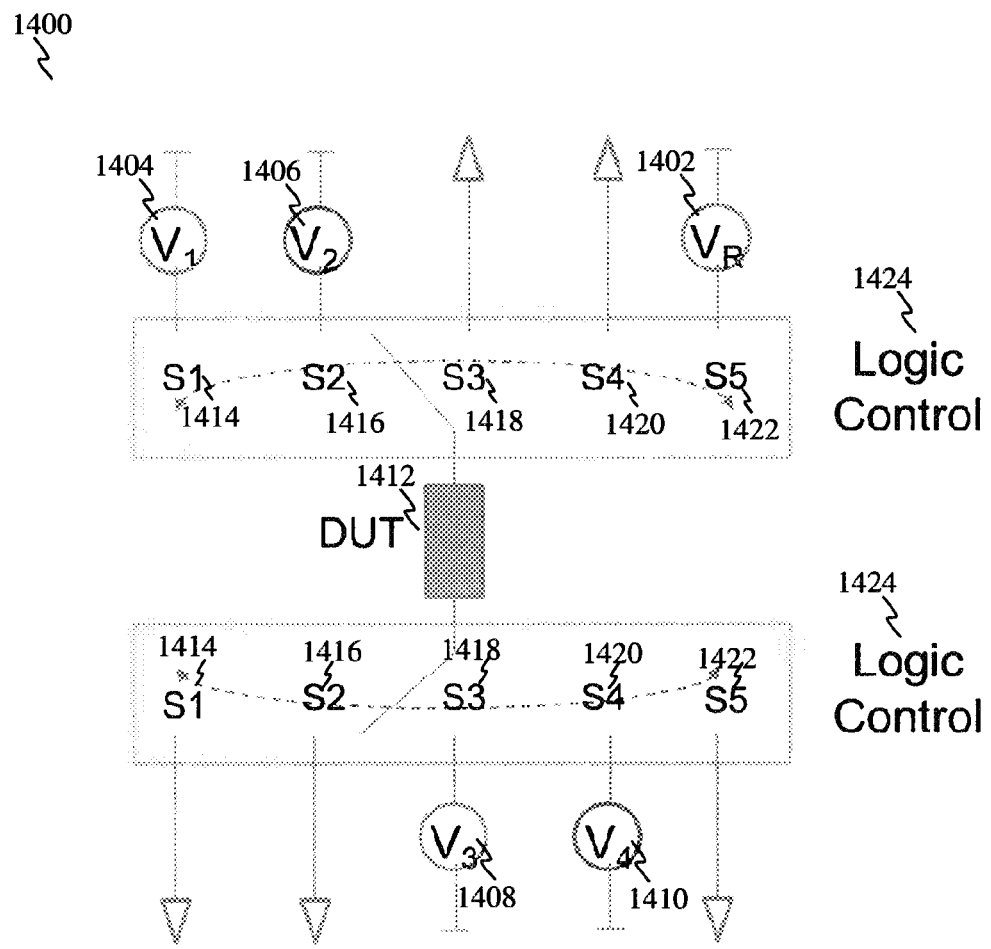
FIG. 14 shows a schematic drawing illustrating the selection of read and write voltage sources for a MJT cell with multi-bit per cell (MBPC), according to various embodiments.

FIG. 14 shows a schematic circuit 1400 for the selection voltages for reading 1402 and writing 1404, 1406, 1408, 1410 of the MTJ (i.e., the DUT) 1412 with multi-bit per cell (MBPC). For write voltages 1404, 1406, 1408, 1410, the individual voltage sources and sink are arranged to give the selected amplitude and driving direction for determined write condition. To write to a storage layer of an EF-MRAM cell 1412, there needs to have an effective voltage bias with the right polarity applied at the storage layer, so that the coercivity of the storage may be lowered for switching. The switching may be done by either absolute electric field or a combination of electric-field and spin transfer toque effect, as described above. The write voltage sources 1404, 1406, 1408, 1410 are orientated and placed close to the storage layer which is to be written. The bidirectional writing circuit introduced allows for the writing of storage layer on top and bottom of the MPBC MTJ cell 1412, selectively. By selectively switching the corresponding free (storage) layers using S1 1414, S2 1416, S3 1418, S4 1420 four different resistance states corresponding to the four possible magnetization orientations in the two magnetic free layers. The logic control module 1424 is used to activate the switches 1414, 1416, 1418, 1420, 1422, so that the desired voltage is sent to the MPBC-MTJ cell 1412 to perform a read or write operation.

Figure 15:
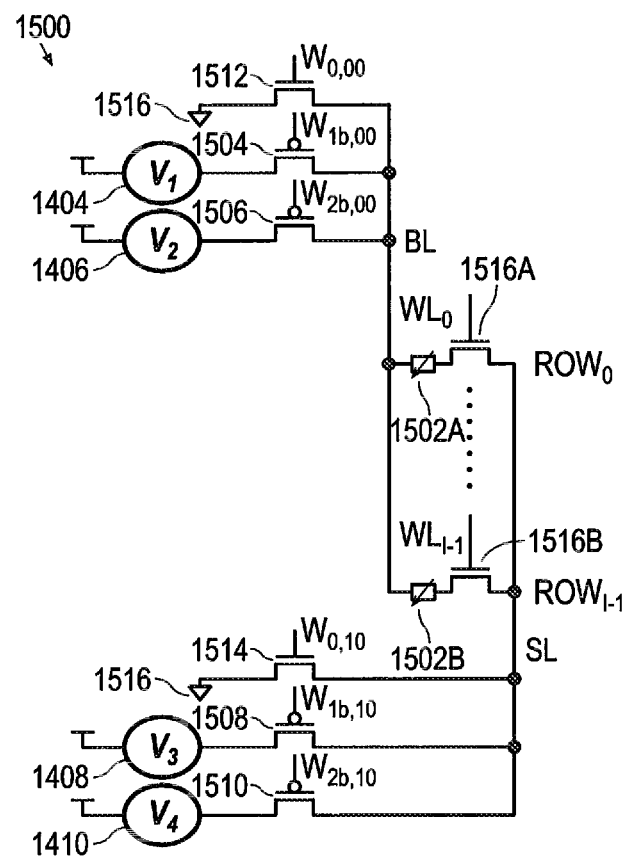
FIG. 15 shows a schematic drawing of the writing circuit for a unit block of MBPC EF-MRAM memory array, according to various embodiments.

FIG. 15 shows a schematic layout of the writing circuit 1500 for multi-bit-per-cell MTJ array 1502A, 1502B in a unit sub-array with the implementation with CMOS technology. Adjacent to each voltage terminal 1404, 1406, 1408, 1410, there is a PMOS transistor 1504, 1506, 1508, 1510 used for the selection of the source. Similarly, an NMOS transistor 1512, 1514 is used adjacent to the ground terminal 1516. This arrangement is needed to avoid generation of body effect in the transistor when the respective transistor is connected in an opposite polarity. If not, the transistors may not be able to drive the desired amount of current, and the circuit may fail.

The select transistor 1516A, 1516B, which connected adjacent to the MBPC MTJ cell 1502A, 1502B, is experiencing bidirectional write voltages (i.e., $V_1$ 1404 and $V_2$ 1406 have current flowing in a direction from the BL through the cells 1502A, 1502B to ground 1516; while V 1408 and $V_4$ 1410 have current flowing in the opposite direction from the SL through the cells 1502A, 1502B to ground 1516. $V_1$ 1404 and $V_2$ 1406 may refer to $V_1$ 602 and $V_2$ 604 of FIG. 6.

To avoid deterioration of the driving current of the select transistor, $V_1$ 1404 ($V_1 > V_2$) needs to have an amplitude which is greater than $V_3$ 1408 and $V_4$ 1410. In addition, the storage layer which is harder to switch and requires more current/voltage to switch, is placed closer to the terminal node connecting to $V_1$ 1404 and $V_2$ 1406. The routing path to each cell is designed to be symmetric, so that each cell has the same write and read environment. This is advantageous because the write and read speed to each cell 1502A, 1502B may be managed the same.

To perform a write operation on the cell at row$_0$, write enable (WE) and word line WL$_0$ is activated to select the cell. To send in $V_1$ pulse 1404, W$_{1b,00}$ 1518 and W$_{0,10}$ 1520 are activated while the other transistors are switched off. The voltage pulse 1404 is delivered from top to bottom and to the cell 1502A, following the path which is activated. Sequentially, it terminates at the ground terminal 1516 and all the switches are turned off. The pulse width may be controlled by the duration of WE signal.

Figure 16:
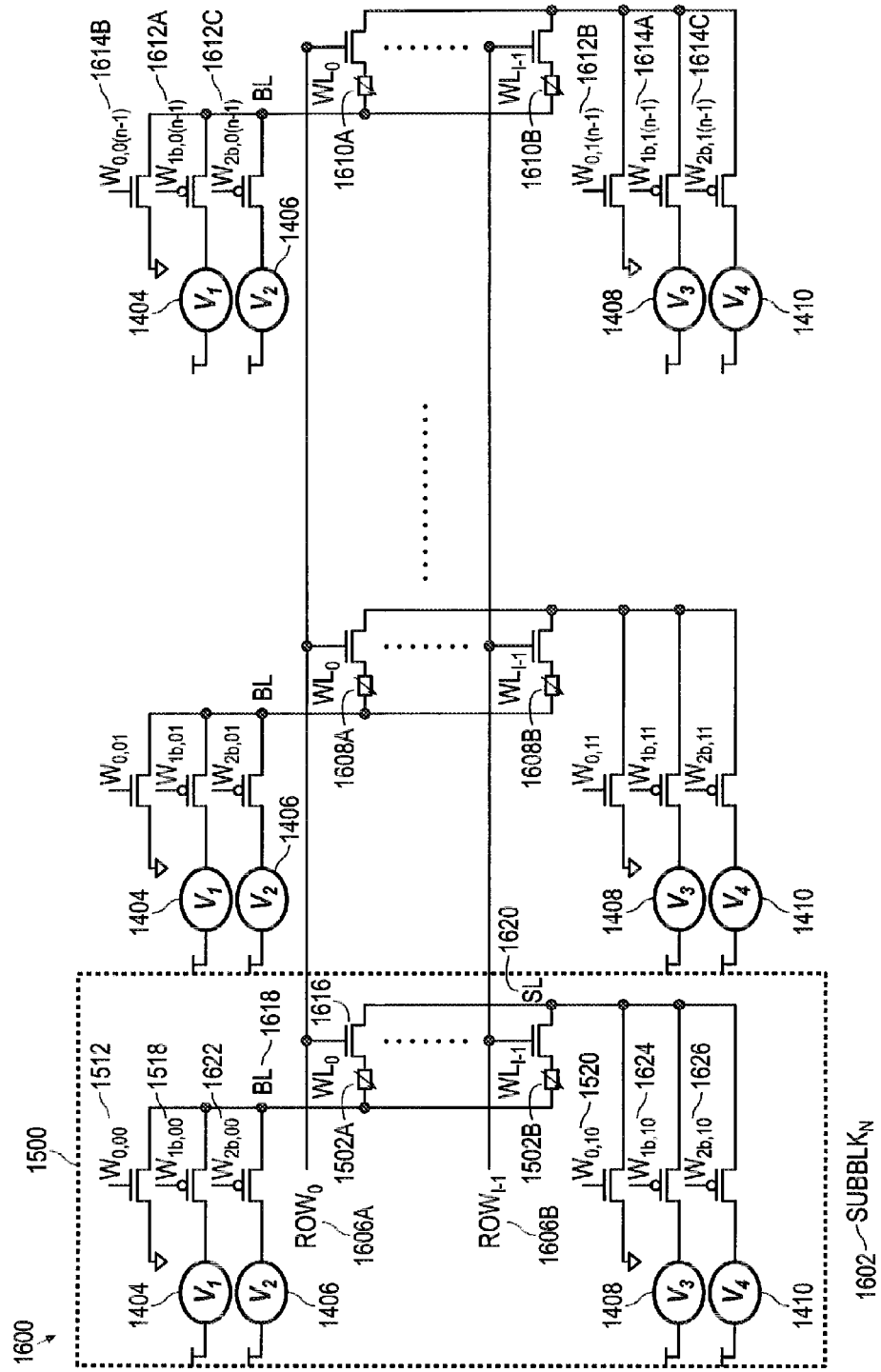
FIG. 16 shows a schematic drawing of the writing circuit for sub-blocks of MBPC EF-MRAM memory array, according to various embodiments.

FIG. 16 shows a schematic layout of a writing circuit 1600 with multi-bit-per-cell MTJ array sub-block 1602.

Depending on the loading of the writing circuit 1600, the memory blocks may be broken down to smaller sub-blocks. This is to allow each writing circuit to have sufficient driving loading. Without this partition, the write speed to each cell may be degraded. This is important for high speed memory application as well.

The size of the sub-block (e.g. SUBBLK$_N$ 1602) depend on the loading of the memory cells. In FIG. 16, SUBBLK$_N$ 1602 is made up of the unit block 1500 of FIG. 15 and similar unit block(s) 1604 connected in a manner such that write enable (WE) 1606A, 1606B and electrical signal 1404, 1406, 1408, 1410 are applied to the cells 1502A, 1502B, 1608A, 1608B, 1610A, 1610B in the SUBBLK$_N$ 1602 in parallel. In unit block(s) 1604, the activation of $V_1$ 1404 and $V_2$ 1406 to be applied to cells 1610A, 1610B may be controlled by W$_{1b,0(n-1)}$ 1612A and W$_{2b,0(n-1)}$ 1612C, respectively with W$_{0,1(n-1)}$ 1612B. The activation of $V_3$ 1408 and $V_4$ 1410 to be applied to cells 1610A, 1610B may be controlled by W$_{1b,1(n-1)}$ 1614A and W$_{2b,1(n-1)}$ 1614C, respectively with W$_{0,0(n-1)}$ 1614B.

For example in FIG. 16, to write a logic '00' to the MTJ in the top left-hand column, the row$_0$ word line (WL$_0$) for the MTJ is set high and the select transistor 1616 is switched on. With other transistors switched off and only transistors W$_{1b,00}$ 1518 and W$_{0,10}$ 1520 of the writing circuit 1600 are switched on the voltage pulse $V_1$ 1404 is then injected and flow from the top into the bit line 1618, through the MTJ 1502A and the select transistor 1616 and closes the loop at the ground terminal next to the transistor W$_{0,10}$ 1520. Further, with other transistors switched off and only transistors W$_{1b,10}$ 1508 and W$_{0,00}$ 1512 of the writing circuit 1600 are switched on, the voltage pulse $V_3$ 1408 is then injected and flow from the bottom into the source line 1620, through the MTJ 1502A and the select transistor 1616 and closes the loop at the ground terminal next to the transistor W$_{0,00}$ 1512. In other words, WL$_0$=1; W$_{1b,00}$ 1518=0; W$_{0,10}$ 1520=1; and W$_{2b,00}$ 1622=1, a first logic '0' is written into the first free layer of MRAM cell 1502A. WL$_0$=1; W$_{1b,10}$ 1624=0; W$_{0,00}$ 1512=1; and W$_{2b,10}$ 1626=1, a second logic '0' is written into the second free layer of MRAM cell 1502A.

Figure 17:
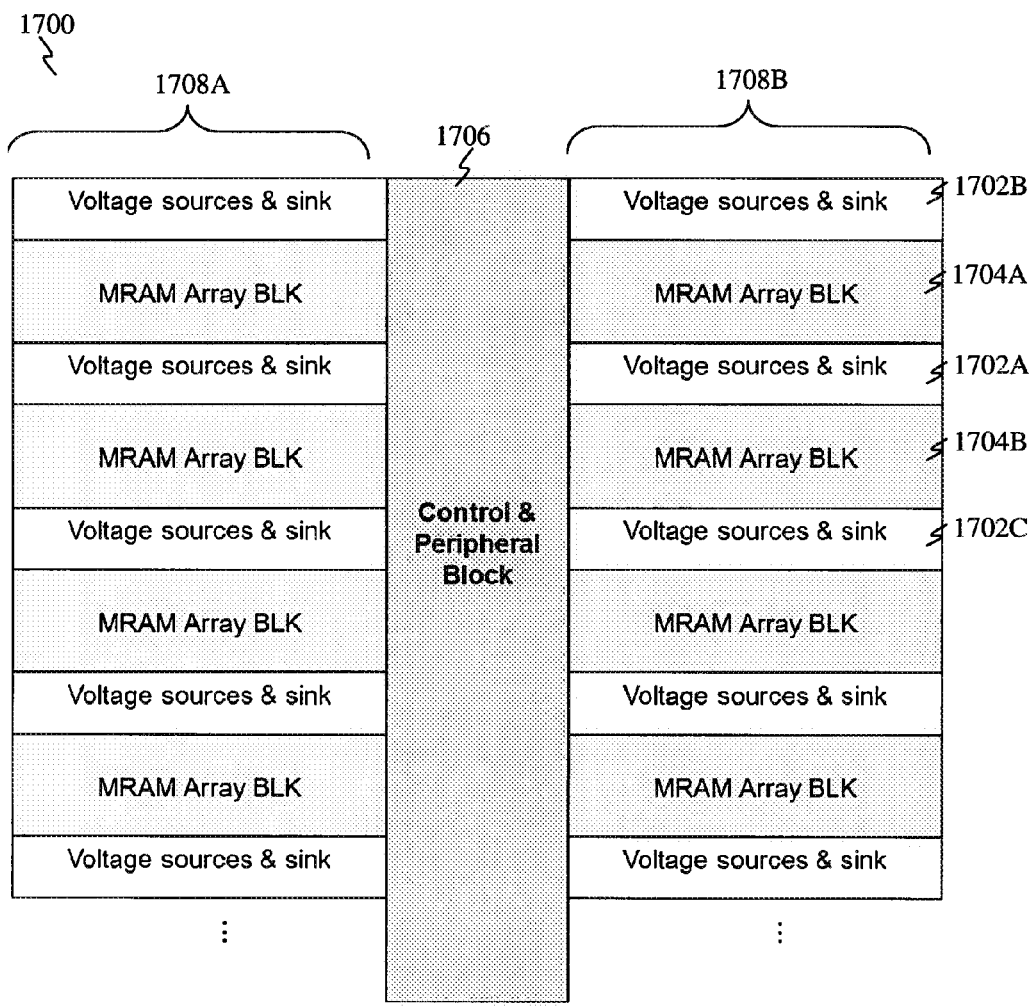
FIG. 17 shows a block diagram of the writing circuit for the MBPC EF-MRAM array sub-blocks of FIG. 16, according to various embodiments.

The writing circuit has the advantage of being shared between two adjacent sub-blocks. The memory sub-blocks and the writing circuits may be arranged as shown in FIG. 17. In FIG. 17, a circuit 1700 includes the bidirectional writing circuit with voltage sources at two sides with the memory sub-blocks. This is to assist in the reduction of silicon area used. In addition, the electrical bias and addresses are reused in the design which results in further reduction of the area used. In this example, the voltage sources and sink 1702A are sandwiched between two similar memory sub-blocks 1704A, 1704B. In addition, at the outer blocks next to the memory sub-blocks 1704A, 1704B, there are voltage sources and sinks 1702B, 1702C to close the voltage path. The logic control and peripheral blocks 1706 lies at the center of two sides of larger memory array groups 1708A, 1708B. For example, the writing circuit may be the writing circuit 1500 of FIG. 15. The control logic block 1706 to manage the signal transfer between memory blocks and the peripheral blocks. This arrangement is beneficial for the reduction of the silicon area used in the memory.

Furthermore, the resistance change from high to low may generate high overdriving current delivering to the MBPC MTJ. To protect the MBPC MTJ from being overdriven with current, a current overdriving protection circuit, similar to that described in FIG. 11, may be added to the MBPC writing circuit.

A sense circuit according to various embodiments will now be described below, by way of examples and not limitations.

Figure 18:
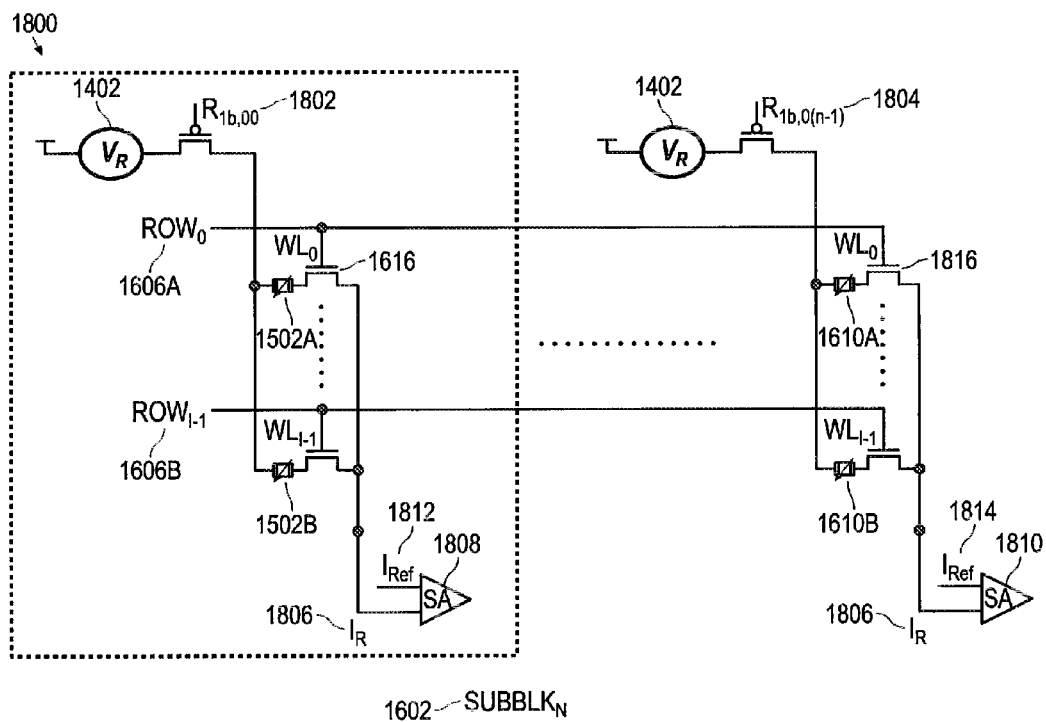
FIG. 18 shows a schematic drawing of a sense circuit for the MBPC EF-MRAM array sub-blocks, according to various embodiments.

As shown in FIG. 18, a read voltage ($V_R$) 1402 and current sense amplifiers (SA) 1808, 1810 are used for the read operation in a memory sub-block (e.g., SUBBLK$_N$ 1602). In the following, the MBPC MTJ cell 1502A at column 0 and row 0 is used as an example for the read operation. WL$_0$ is activated to select the cells at row$_0$. When read enable (RE) is activated, R$_{1b,00}$ 1802 is active while the other switched are in the off-state. This sequence activates only the cell 1502A at row 0 column 0. The read voltage 1402 is applied across the path addressing the selected cell 1502A. While the cell 1502A is being read, the read current 1806 from the cell is compared by the SA 1808, 1810. If the routing of the lines to the SA 1808, 1810 is long, the sense circuit 1800 may be broken down addressed to smaller memory sub-blocks. This also helps to reduce the potential drop along the routing line and improve on the reading speed.

Figure 19:
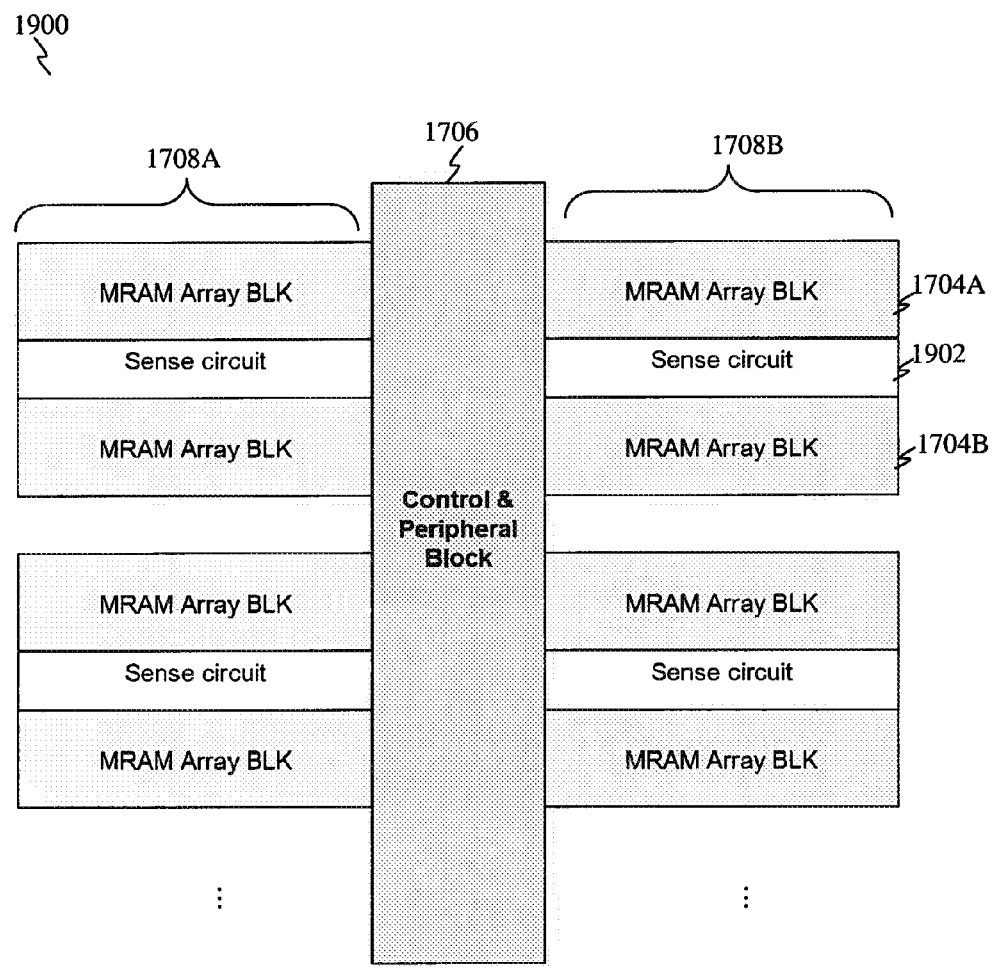
FIG. 19 shows a block diagram of the sense circuit for the MBPC EF-MRAM array sub-blocks of FIG. 18, according to various embodiments.

The sense circuit (e.g., the sense circuit 1800 of FIG. 18) may be arranged to be shared between two adjacent memory sub-blocks. FIG. 19 shows the block diagram of the sense circuits 1900 shared between the memory sub-blocks. This helps to reduce the silicon area used for the memory application. Similar to that for the SBPC sense circuit (FIG. 13), in addition, the electrical bias and addresses are reused in the design which results in further reduction of the area used. In this example, the sense circuit 1902 is sandwiched between two similar memory sub-blocks 1704A, 1704B. The logic control and peripheral blocks 1706 lies at the center of two sides of larger memory array groups 1708A, 1708B. For example, the sense circuit 1902 may be the sense circuit 1800 of FIG. 18.

Figure 20:
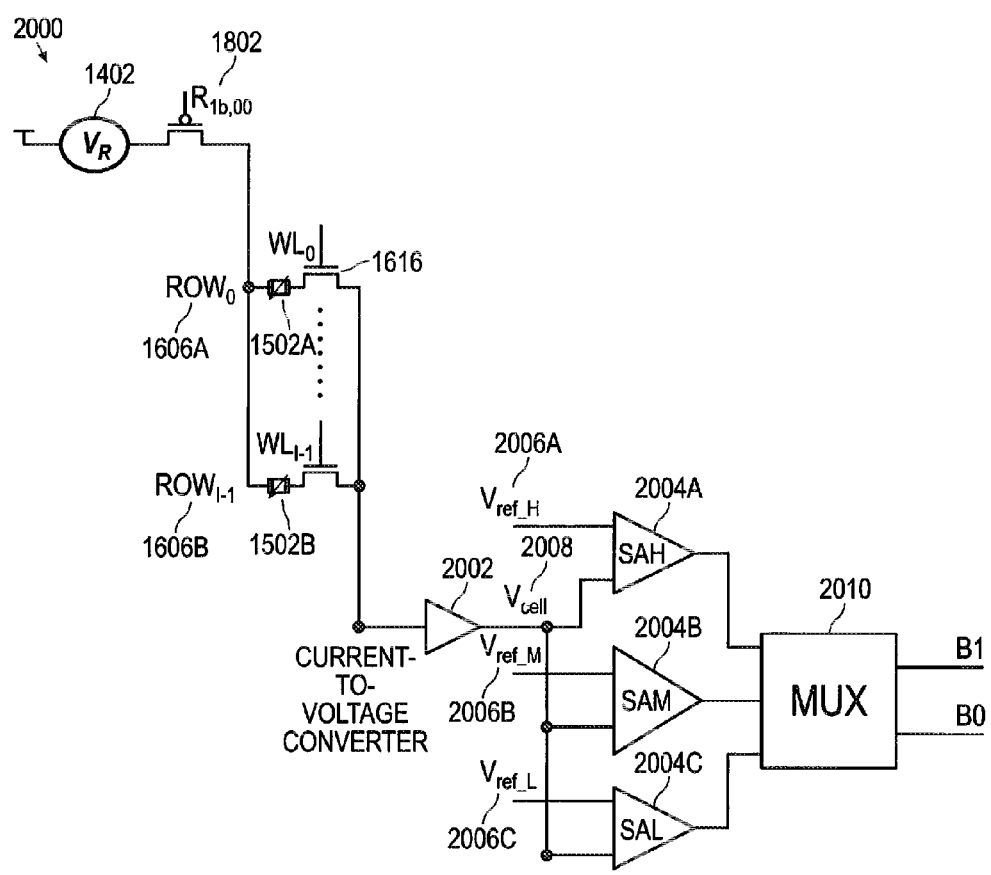
FIG. 20 shows a schematic drawing of another example of the sense circuit for the MBPC EF-MRAM array sub-block, according to various embodiments.

FIG. 20 shows a schematic arrangement of a sense circuit 2000 (e.g., which may refer to the sense circuit 1800 of FIG. 18) which may be configured together with a current-to-voltage converter 2002 and subsequent sense amplifier 2004A, 2004B, 2004C to extract binary information stored in the MBPC MTJ cell 1502A, 1502B.

For example, to read the information stored in the top-leftmost cell 1502A, WL$_0$ 1616 is activated. The different voltage level converted by the current-to-voltage converter 2002 allows for the discretization of four voltage levels into binary bits, by voltage level comparison using the sense amplifiers SAH 2004A, SAM 2004B, and SAL 2004C with V$_{ref\_H}$ 2006A, V$_{ref\_M}$ 2006B, and V$_{ref\_L}$ 2006C, respectively. A multiplexer 2010 receives the outputs from the comparators and decode the bits B1 and B0 based on these outputs.

Table 1 shows the comparison of the voltage from the cell (V$_{cell}$) 2008 with V$_{ref\_H}$ 2006A, V$_{ref\_M}$ 2006B, and V$_{ref\_L}$ 2006C to determine or decode the readout bits.

TABLE 1

| Voltage comparison | Readout bits |
|---|---|
| V$_{cell}$ ≤ V$_{ref\_L}$ | 00 |
| V$_{ref\_L}$ < V$_{cell}$ ≤ V$_{ref\_M}$ | 01 |
| V$_{ref\_M}$ < V$_{cell}$ ≤ V$_{ref\_H}$ | 10 |
| V$_{cell}$ > V$_{ref\_H}$ | 11 |

Although one memory unit-block is used for illustration in FIG. 20, it should be understood and appreciated that the circuit 2000 may be shared and extended to bigger memory sub-blocks.

Figure 21:
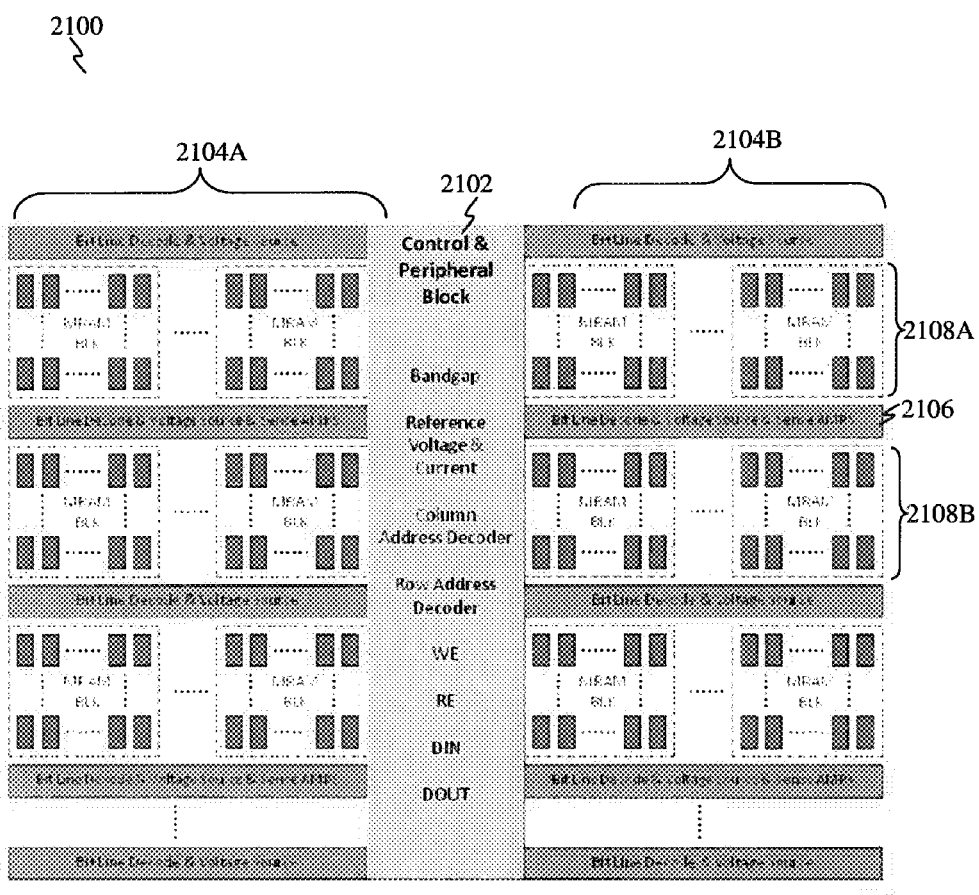
FIG. 21 shows a block diagram of the floorplan for EF-MRAM, according to various embodiments.

FIG. 21 shows a floorplan for a circuit 2100 for the EF-MRAM for single-bit-per-cell and multi-bit-per-cell EF-MRAM. The circuit 2100 may include writing circuits (e.g., writing circuit 100 of FIG. 1, writing circuit 700 of FIG. 7, writing circuit 1500 of FIG. 15) and sense circuits (e.g., sense circuit 1200 of FIG. 12, sense circuit 1800 of FIG. 18) arranged with a control and peripheral block 2102 in between two array groups 2104A, 2104B. The writing circuits and sense circuits 2106 are shared between two MRAM block (e.g., MRAM BLK 2108A, 2108B). The control and peripheral block 2102 may provide functions and information, for example, bandgap, reference voltage and current generators, write and read drivers, column address decoding, row address decoding, write enable (WE), read enable (RE), data in (DEN) and data out (DOUT).

The circuit 2100 with the floorplan as shown in FIG. 21 helps to reduce the silicon area used for the memory application.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A writing circuit for a magnetoresistive memory cell having a fixed magnetic layer and a free magnetic layer, the writing circuit comprising:
   a first connecting terminal configured to provide a first electrical signal to switch a variable magnetization orientation of the free magnetic layer from a first magnetization orientation to a second magnetization orientation;
   a second connecting terminal configured to provide a second electrical signal to switch the magnetization orientation of the free magnetic layer from the second magnetization orientation to the first magnetization orientation; and
   a sourcing switch configured to provide for a write operation a direct connection of one of the first connecting terminal or the second connecting terminal to a node coupleable to the magnetoresistive memory cell,
   wherein the first electrical signal and the second electrical signal have different amplitudes; and
   wherein the first electrical signal and the second electrical signal are of the same polarity.

2. The writing circuit of claim 1, wherein the first electrical signal and the second electrical signal are positive voltage signals.

3. The writing circuit of claim 1, wherein the first electrical signal has a voltage amplitude larger than that of the second electrical signal.

4. The writing circuit of claim 1, further comprising a control switch configured to control the write operation to the magnetoresistive memory cell.

5. The writing circuit of claim 4, wherein the control switch is controllable by a word line of the magnetoresistive memory cell.

6. The writing circuit of claim 1,
wherein the magnetoresistive memory cell further comprises a second free magnetic layer; and
wherein the writing circuit further comprises
a third connecting terminal configured to provide a third electrical signal to switch a variable magnetization orientation of the second free magnetic layer from a first magnetization orientation to a second magnetization orientation;
a fourth connecting terminal configured to provide a fourth electrical signal to switch the magnetization orientation of the second free magnetic layer from the second magnetization orientation to the first magnetization orientation; and
a second sourcing switch configured to provide for the write operation a connection of one of the third connecting terminal or the fourth connecting terminal to a second node coupleable to the magnetoresistive memory cell,
wherein the third electrical signal and the fourth electrical signal have different amplitudes; and
wherein the third electrical signal and the fourth electrical signal are of the same polarity.

7. The writing circuit of claim 6, wherein the third electrical signal and the fourth electrical signal are positive voltage signals.

8. The writing circuit of claim 7, wherein the first electrical signal has a voltage amplitude larger than the respective voltage amplitudes of the third electrical signal and the fourth electrical signal.

9. The writing circuit of claim 6, further comprising
a first reference potential terminal; and
a second reference potential terminal,
wherein the sourcing switch is further configured to provide for the write operation a connection of the first reference potential terminal to the node when the second sourcing switch is providing the connection of one of the third connecting terminal or fourth connecting terminal to the second node; and
wherein the second sourcing switch is further configured to provide for the write operation a connection of the second reference potential terminal to the second node when the sourcing switch is providing the connection of one of the first connecting terminal or second connecting terminal to the node.

10. The writing circuit of claim 9, wherein the sourcing switch comprises a plurality of transistors respectively comprising a source terminal, a drain terminal and a gate terminal.

11. The writing circuit of claim 10,
wherein for the sourcing switch, the drain terminals of the transistors are configured to couple to a bit line, the source terminal of a first transistor of the plurality of transistors is coupled to the first connecting terminal, die source terminal of a second transistor of the plurality of transistors is coupled to the second connecting terminal, and the source terminal of a third transistor of the plurality of transistors is coupled to the first reference potential terminal.

12. The writing circuit of claim 9, wherein the second sourcing switch comprises a plurality of transistors respectively comprising a source terminal, a drain terminal and a gate terminal.

13. The writing circuit of claim 12,
wherein for the second sourcing switch, the drain terminals of the transistors are configured to couple to a source line, the source terminal of a first transistor of the plurality of transistors is coupled to the third connecting terminal, the source terminal of a second transistor of the plurality of transistors is coupled to the fourth connecting terminal, and the source terminal of a third transistor of the plurality of transistors is coupled to the second reference potential terminal.

14. The writing circuit of claim 6, further comprising a first voltage source coupleable to the first connecting terminal, a second voltage source coupleable to the second connecting terminal, a third voltage source coupleable to the third connecting terminal, and a fourth voltage source coupleable to the fourth connecting terminal.

15. The writing circuit of claim 6, further comprising a current overdriving protection circuit configured to limit the current level of one of the first electrical signal or the third electrical signal,
wherein the first magnetization orientation and the second magnetization orientation of the free magnetic layer respectively correspond to an anti-parallel state and a parallel state of the free magnetic layer with reference to the fixed magnetic layer; and
wherein the first magnetization orientation and the second magnetization orientation of the second free magnetic layer respectively correspond to an anti-parallel state and a parallel state of the second free magnetic layer with reference to the fixed magnetic layer.

16. The writing circuit of claim 1, further comprising an address decoder and memory controller for controlling the write operation for the magnetoresistive memory cell.

17. A memory cell arrangement comprising:
a plurality of magnetoresistive memory cells, each magnetoresistive memory cell having a fixed magnetic layer and a free magnetic layer; and
a writing circuit for the magnetoresistive memory cell, the writing circuit comprising:
a first connecting terminal configured to provide a first electrical signal to switch a variable magnetization orientation of the free magnetic layer from a tint magnetization orientation to a second magnetization orientation;
a second connecting terminal configured to provide a second electrical signal to switch the magnetization orientation of the free magnetic layer from the second magnetization orientation to the first magnetization orientation; and
a sourcing switch configured to provide for a write operation a direct connection of one of the first connecting terminal or the second connecting terminal to a node coupleable to the magnetoresistive memory cell,
wherein the first electrical signal and the second electrical signal have different amplitudes; and
wherein the first electrical signal and the second electrical signal are of the same polarity.

18. The memory cell arrangement of claim 17, wherein the magnetoresistive memory cell comprises a spin transfer torque magnetoresistive random access memory with electric field assistance.

19. A method of writing into a target magnetoresistive memory cell of a memory cell arrangement, the method comprising:
- providing a first electrical signal to switch a variable magnetization orientation of a free magnetic layer of the target magnetoresistive memory cell from a first magnetization orientation to a second magnetization orientation;
- providing a second electrical signal to switch the magnetization orientation of the free magnetic layer from the second magnetization orientation to the first magnetization orientation; and
- providing for a write operation one of the first electrical signal or the second electrical signal directly to a node coupleable to the magnetoresistive memory cell,
  - wherein the first electrical signal and the second electrical signal have different amplitudes; and
  - wherein the first electrical signal and the second electrical signal are of the same polarity.

20. The method of claim 19, further comprising
- providing a third electrical signal to switch a variable magnetization orientation of a second free magnetic layer of the target magnetoresistive memory cell from a first magnetization orientation to a second magnetization orientation;
- providing a fourth electrical signal to switch the magnetization orientation of the second free magnetic layer from the second magnetization orientation to the first magnetization orientation; and
- providing for the write operation one of the third electrical signal or the fourth electrical signal to a second node coupleable to the magnetoresistive memory cell,
  - wherein the third electrical signal and the fourth electrical signal have different amplitudes; and
  - wherein the third electrical signal and the fourth electrical signal are of the same polarity.

* * * * *